(12) United States Patent
Park et al.

(10) Patent No.: US 7,622,307 B2
(45) Date of Patent: Nov. 24, 2009

(54) SEMICONDUCTOR DEVICES HAVING A PLANARIZED INSULATING LAYER AND METHODS OF FORMING THE SAME

(75) Inventors: Jae-Hyun Park, Gyeonggi-do (KR); Jae-Hee Oh, Gyeonggi-do (KR); Won-Cheol Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 249 days.

(21) Appl. No.: 11/184,701

(22) Filed: Jul. 19, 2005

(65) Prior Publication Data

US 2006/0011959 A1    Jan. 19, 2006

(30) Foreign Application Priority Data

Jul. 19, 2004    (KR)  ............... 10-2004-0056127

(51) Int. Cl.
   *H01L 21/4763*    (2006.01)
(52) U.S. Cl. .................. 438/3; 438/253; 438/258; 438/396; 438/597; 438/623; 257/E21.647; 257/E21.648; 257/E21.664; 257/E23.147; 257/E27.004
(58) Field of Classification Search .......... 438/6, 438/128, 598, 232–234, 3, 253, 258, 396, 438/597, 623, 631, 632, 800, 900; 257/246, 257/421, 295, E23.001, E21.008, 647, 648, 257/664, E23.147, E27.004
See application file for complete search history.

(56) References Cited

U.S. PATENT DOCUMENTS

| | | | | |
|---|---|---|---|---|
| 5,041,393 A | * | 8/1991 | Ahrens et al. | 438/172 |
| 5,789,764 A | * | 8/1998 | McCollum | 257/76 |
| 5,955,758 A | * | 9/1999 | Sandhu et al. | 257/306 |
| 6,291,355 B1 | * | 9/2001 | Liu et al. | 438/706 |
| 6,423,621 B2 | * | 7/2002 | Doan et al. | 438/597 |
| 6,946,704 B2 | * | 9/2005 | Matsuoka et al. | 257/330 |
| 6,995,388 B2 | * | 2/2006 | Hwang et al. | 257/4 |
| 7,061,005 B2 | * | 6/2006 | Chang | 257/3 |
| 7,071,485 B2 | * | 7/2006 | Takaura et al. | 257/3 |
| 7,115,927 B2 | * | 10/2006 | Hideki et al. | 257/296 |
| 7,394,087 B2 | * | 7/2008 | Kuh et al. | 257/2 |

(Continued)

FOREIGN PATENT DOCUMENTS

JP        2000-150810        5/2000

(Continued)

OTHER PUBLICATIONS

Korean Office Action for Korean application No. 10-2004-0056127; dated Mar. 16, 2006.

*Primary Examiner*—Michael S Lebentritt
(74) *Attorney, Agent, or Firm*—Myers Bigel Sibley & Sajovec, P.A.

(57) ABSTRACT

A semiconductor device includes at least one phase-change pattern disposed on a semiconductor substrate. A planarized capping layer, a planarized protecting layer, and a planarized insulating layer are sequentially stacked to surround sidewalls of the at least one phase-change pattern. An interconnection layer pattern is disposed on the planarized capping layer, the planarized protecting layer, and the planarized insulating layer. The interconnection layer pattern is in contact with the phase-change pattern.

23 Claims, 34 Drawing Sheets

U.S. PATENT DOCUMENTS

| | | | |
|---|---|---|---|
| 7,411,208 B2* | 8/2008 | Hwang et al. | 257/4 |
| 2003/0209746 A1* | 11/2003 | Horii | 257/295 |
| 2004/0038518 A1* | 2/2004 | Chung | 438/631 |
| 2005/0263823 A1* | 12/2005 | Hwang et al. | 257/368 |

FOREIGN PATENT DOCUMENTS

| | | |
|---|---|---|
| JP | 2001-036026 | 2/2001 |
| JP | 2002-289794 | 10/2002 |
| KR | 1020030088574 A | 11/2003 |
| KR | 1020040008718 A | 1/2004 |
| KR | 1020040047272 A | 5/2004 |

* cited by examiner

SEMICONDUCTOR DEVICES HAVING A PLANARIZED INSULATING LAYER AND METHODS OF FORMING THE SAME

CROSS-REFERENCE TO RELATED APPLICATION

This application claims the benefit under 35 USC § 119 of Korean Patent Application No. 10-2004-0056127, filed Jul. 19, 2004, the disclosure of which is hereby incorporated by reference in its entirety.

BACKGROUND OF INVENTION

1. Technical Field

The present invention relates generally to semiconductor devices and methods of fabricating the same, and, more particularly, to semiconductor devices having a planarized insulating layer and methods of fabricating the same.

2. Discussion of the Related Art

Generally, a PRAM (phase-change random access memory) has a phase-change pattern and an interconnection layer pattern running across an active region within a range of a given design rule. The interconnection layer pattern is disposed on and is in contact with the phase-change pattern. The phase-change pattern includes a GST ($Ge_xSe_yTe_z$) material. The interconnection layer pattern may comprise tungsten (W). The interconnection layer pattern is in contact with the phase-change pattern through a contact hole.

However, in such a PRAM, a contact hole may expose sidewalls of the phase-change pattern with the design rule of the PRAM reduced. This means it may be more difficult to align the contact hole on the phase-change patterns within a range of the reduced design rule. This is because the phase-change pattern and the contact hole are also reduced in their sizes within a range of the reduced design rule. For this reason, the contact hole may be disposed so as to expose the sidewalls of the phase-change pattern. After the contact hole is formed, a CVD (chemical vapor deposition) process using a tungsten fluoride ($WF_x$) gas may be performed on the contact hole. In the CVD process, the gas reacts with the phase-change pattern to vaporize the GST material, without forming a W layer filling the contact hole.

Further, an MRAM (magnetic random access memory) has a magnetic tunnel junction pattern and an interconnection layer pattern running across an active region within a range of a given design rule. The interconnection layer pattern is disposed on and is in contact with the magnetic tunnel junction pattern. The magnetic tunnel junction pattern has a magnetic tunnel junction layer pattern. The magnetic tunnel junction layer pattern may include a diamagnetic material layer (e.g. $Pt_xMn_y$ layer) as well as a ferromagnetic material layer (e.g. $Ni_xFe_y$ layer), a dielectric layer (e.g. $Al_xO_y$ layer), and a spin fixed layer (e.g. $Co_xFe_y$ layer), which are sequentially disposed in stack. The interconnection layer pattern may comprise tungsten (W). The interconnection layer pattern is in contact with the magnetic tunnel junction pattern through a contact hole.

Like the PRAM, the MRAM may have tungsten filling the contact hole to overcome an aspect ratio of the contact hole. The tungsten is formed by using a CVD process using a tungsten fluoride ($WF_x$) gas. The CVD process is performed at a temperature of about 350° C. or higher, which may increase resistance of the magnetic tunnel junction layer pattern. This may result in decreasing a current sensing margin being capable of reading data of a selected cell inside an active region, and losing magnetic characteristics of the magnetic tunnel junction layer pattern.

On the other hand, Japan Patent Publication No. 2001-36026 to Kanetani Hiroyuki, et al discloses a semiconductor device and method of forming thereof. According to Kanetani Hiroyuki, et al., a semiconductor device and method of forming thereof includes a ferroelectric capacitor disposed in a semiconductor substrate. The ferroelectric capacitor includes a lower platinum (Pt) layer, a PZT ($PbZr_{1-x}TiO$) layer and an upper platinum (Pt) layer, which are sequentially disposed in stack.

The ferroelectric capacitor is surrounded by a hydrogen barrier layer. The hydrogen barrier layer is formed to cover the ferroelectric capacitor downward from an upper portion of the semiconductor substrate. This is to minimize the hydrogen ions coming into the ferroelectric capacitor during semiconductor fabrication processes. Then, an interlayer insulating layer is formed to cover the hydrogen barrier layer.

The semiconductor device and the method of forming thereof further include an interconnection line being in contact with the ferroelectric capacitor. The interconnection line penetrates the interlayer insulating layer and the hydrogen barrier layer, and is disposed on the upper platinum layer of the ferroelectric capacitor.

However, in the semiconductor device and the method of forming thereof, a contact hole may be formed in the interlayer insulating layer and the hydrogen barrier layer to make the interconnection line and the upper platinum layer be in contact with each other. The contact hole may not expose the upper platinum layer within a range of a reduced design rule. This may deteriorate electrical characteristics of the semiconductor device.

SUMMARY OF THE INVENTION

According to some embodiments of the invention, a semiconductor device includes at least one phase-change pattern disposed on a semiconductor substrate. A planarized capping layer, a planarized protecting layer, and a planarized insulating layer are sequentially stacked to surround sidewalls of the at least one phase-change pattern. An interconnection layer pattern is disposed on the planarized capping layer, the planarized protecting layer, and the planarized insulating layer. The interconnection layer pattern is in contact with the phase-change pattern.

In further embodiments of the present invention, a semiconductor device includes at least one phase-change pattern disposed on a semiconductor substrate. A planarized insulating layer is disposed so as to surround sidewalls of the at least one phase-change pattern. An interconnection layer pattern is disposed on the planarized insulating layer and is in contact with the phase-change pattern.

In further embodiments of the present invention, a semiconductor device includes at least one magnetic tunnel junction pattern disposed on a semiconductor substrate. A planarized capping layer, a planarized protecting layer, and a planarized insulating layer are sequentially stacked to surround sidewalls of the at least one magnetic tunnel junction pattern. An interconnection layer pattern is disposed on the planarized capping layer, the planarized protecting layer, and the planarized insulating layer. The interconnection layer pattern is in contact with the magnetic tunnel junction pattern.

In further embodiments of the present invention, a semiconductor device includes at least one magnetic tunnel junction pattern disposed on a semiconductor substrate. A planarized insulating layer is disposed so as to surround sidewalls of the at least one magnetic tunnel junction pattern.

An interconnection layer pattern is disposed on the planarized insulating layer and is in contact with the magnetic tunnel junction pattern.

In further embodiments of the present invention, a semiconductor device is formed by forming at least one phase-change pattern on a semiconductor substrate. A planarized capping layer, a planarized protecting layer, and a planarized insulating layer are sequentially formed to cover the phase-change pattern. The at least one phase-change pattern is exposed such that the planarized insulating layer, the planarized protecting layer, and the planarized capping layer surround sidewalls of the at least one phase-change pattern. An interconnection layer pattern is formed on the planarized insulating layer, the planarized protecting layer, and the planarized capping layer so as to be in contact with the at least one phase-change pattern.

In further embodiments of the present invention, a semiconductor device is formed by forming at least one phase-change pattern on a semiconductor substrate. A planarized capping layer and a planarized protecting layer are sequentially formed on the at least one phase-change pattern. A planarized insulating layer is formed to cover the planarized protecting layer, the planarized capping layer, and the phase-change pattern. The at least one phase-change pattern is exposed such that the planarized insulating layer surrounds sidewalls of the at least one phase-change pattern. An interconnection layer pattern is formed on the planarized insulating layer so as to be in contact with the phase-change pattern.

In further embodiments of the present invention, a semiconductor device is formed by forming at least one magnetic tunnel junction pattern on a semiconductor substrate. A planarized capping layer, a planarized protecting layer, and a planarized insulating layer are sequentially formed to cover the at least one magnetic tunnel junction pattern. The at least one magnetic tunnel junction pattern is exposed such that the planarized insulating layer, the planarized protecting layer, and the planarized capping layer surround sidewalls of the at least one magnetic tunnel junction pattern. An interconnection layer pattern is formed on the planarized insulating layer, the planarized protecting layer, and the planarized capping layer, so as to be in contact with the magnetic tunnel junction pattern.

In further embodiments of the present invention, a semiconductor is formed by forming at least one magnetic tunnel junction pattern on a semiconductor substrate. A planarized capping layer and a planarized protecting layer are sequentially formed on the at least one magnetic tunnel junction pattern. A planarized insulating layer is formed to cover the planarized protecting layer, the planarized capping layer, and the at least one magnetic tunnel junction pattern. The at least one magnetic tunnel junction pattern is exposed such that the planarized insulating layer surrounds sidewalls of the at least one magnetic tunnel junction pattern. An interconnection layer pattern is formed on the planarized insulating layer so as to be in contact with the magnetic tunnel junction pattern.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS OF THE INVENTION

Figure 1:
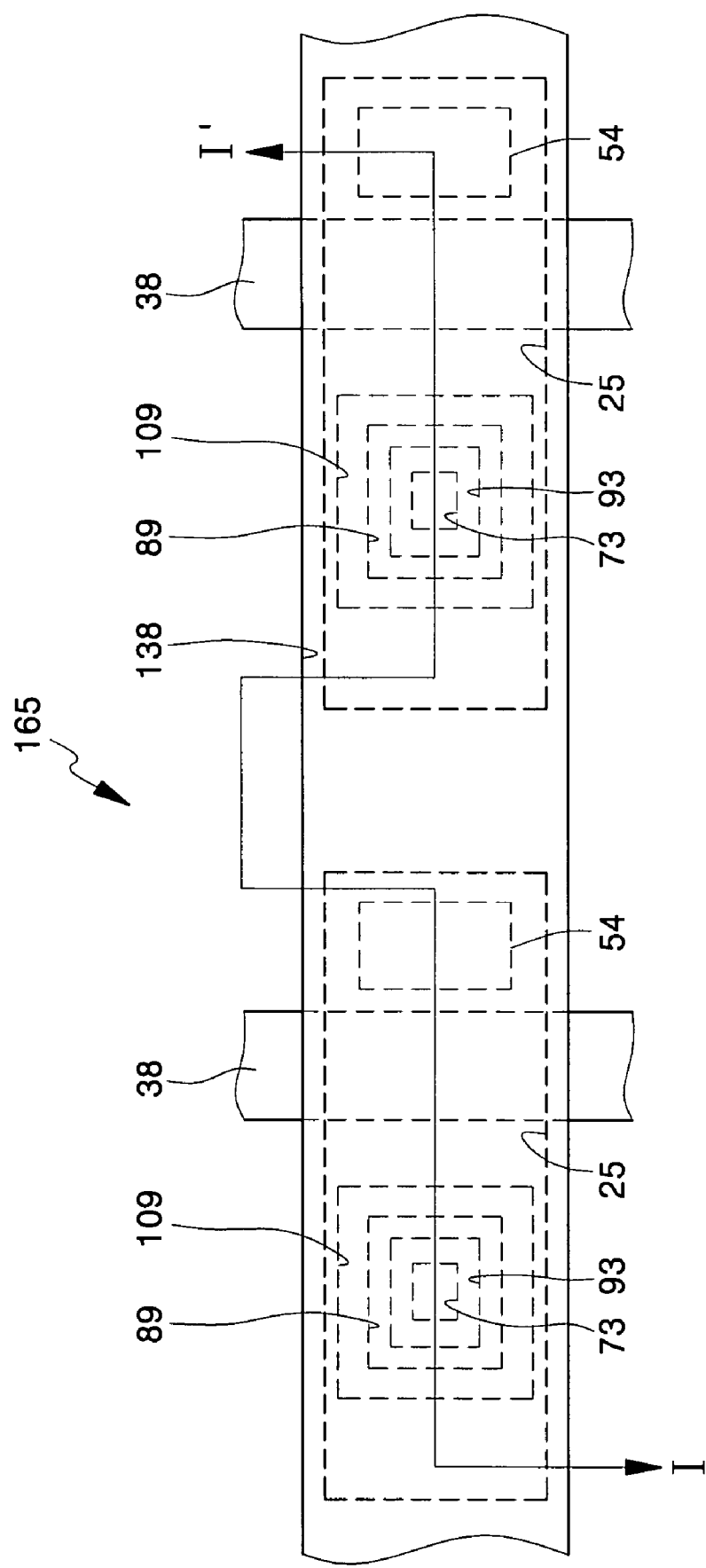
FIGS. 1 and 2 are layouts illustrating semiconductor devices in accordance with some embodiments of the present invention, respectively.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the figures. It will be understood that relative terms are intended to encompass different orientations of the device in addition to the orientation depicted in the figures. For example, if the device in one of the figures were turned over, elements described as being on the "lower" side of other elements would then be oriented on "upper" sides of the other elements. The exemplary term "lower," can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein, but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Figure 2:
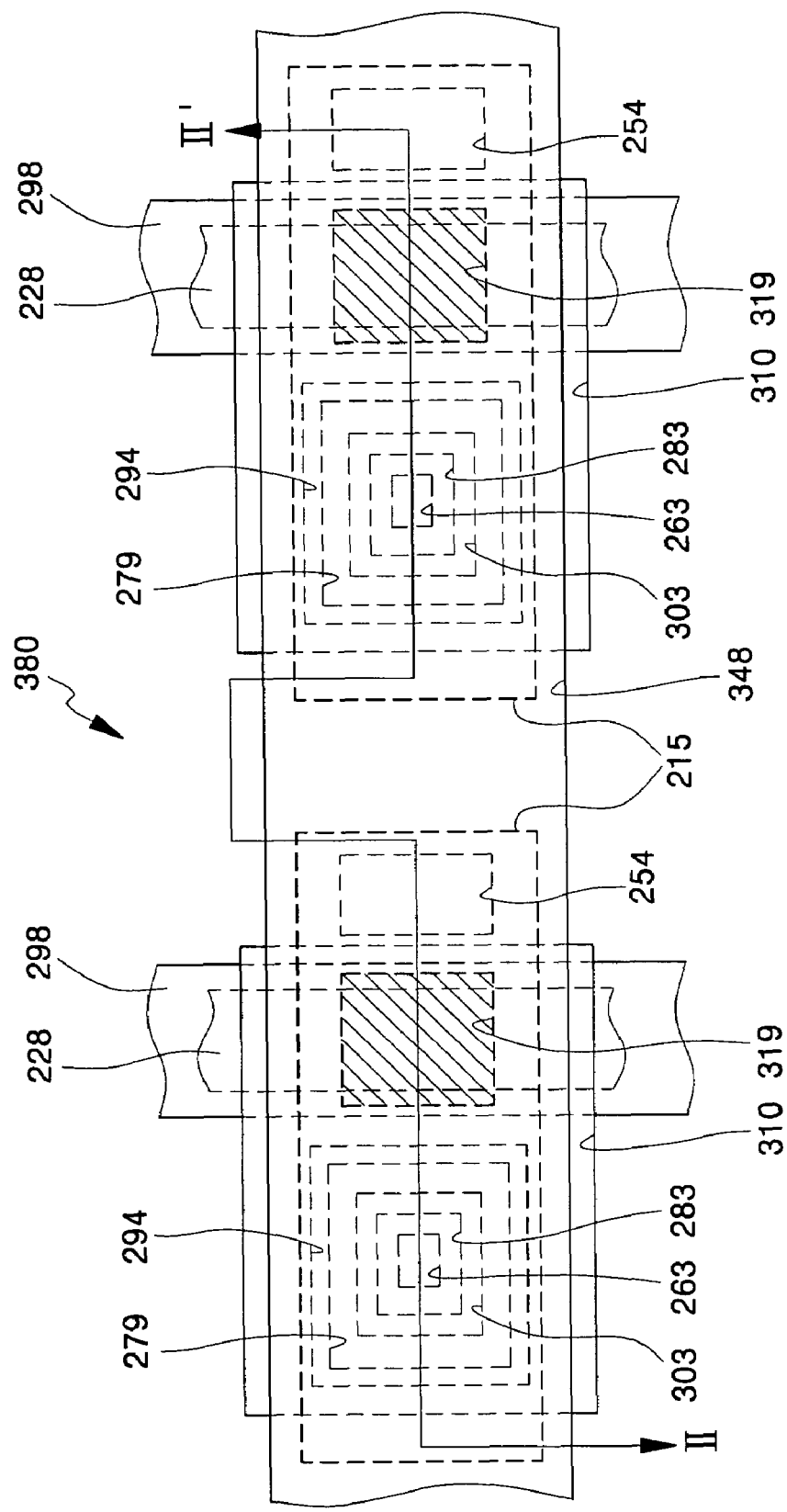
Figure 3:
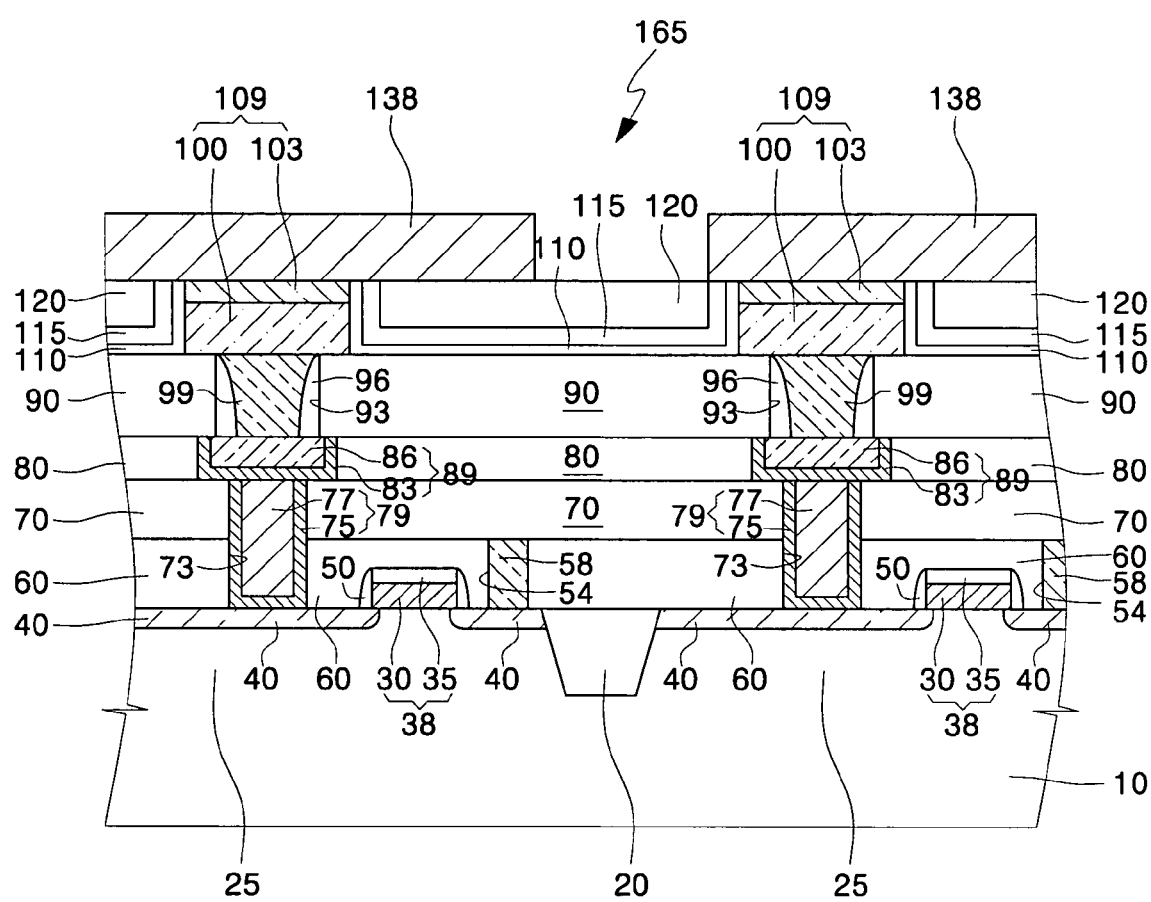
FIG. 3 is a sectional view illustrating a semiconductor device taken along line I-I' of FIG. 1.
Figure 4:
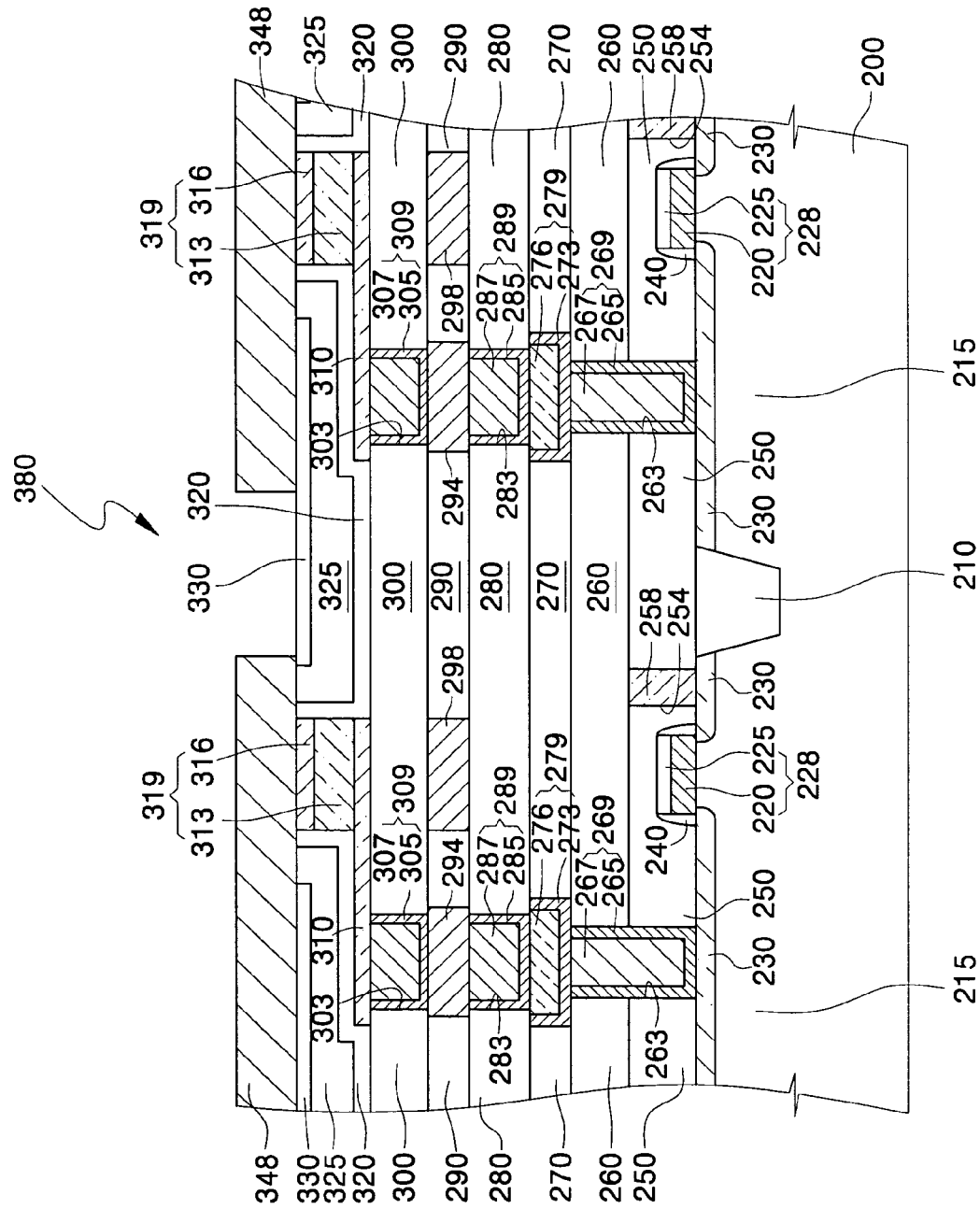
FIG. 4 is a sectional view illustrating a semiconductor device taken along line II-II' of FIG. 2.

FIGS. 1 and 2 are layouts illustrating semiconductor devices according to some embodiments of the invention, respectively. FIGS. 3 and 4 are sectional views illustrating semiconductor devices taken along line I-I' and line II-II' of FIGS. 1 and 2, respectively.

Referring to FIGS. 1 and 3, in the cell structure of a PRAM (phase-change random access memory) 165, a device isolation layer 20 is disposed in a semiconductor substrate 10 to isolate two active regions 25. Phase-change patterns 109 are disposed on the active regions 25, respectively. The phase-change patterns 109, which may be three or more, may be disposed to correspond to the active regions 25 one to one. Each of the phase-change patterns 109 includes a phase-change layer pattern 100 and a phase-change layer node pattern 103, which are sequentially disposed in stack. The phase-change layer node pattern 103 may be titanium nitride (TiN). The phase-change layer pattern 100 may be a composite including, for example, germanium, selenium, and tellurium ($Ge_xSe_yTe_z$).

A planarized capping layer 110, a planarized protecting layer 115, and a planarized insulating layer 120 are sequentially stacked on the semiconductor substrate 10 to surround sidewalls of the phase-change patterns 109. The planarized capping layer 110, the planarized protecting layer 115, and the planarized insulating layer 120 are disposed to conformably cover along the sidewalls of the phase-change patterns 109, and to expose top surfaces of the phase-change patterns 109. On the contrary, only the planarized insulating layer 120, which surrounds the phase-change patterns 109, may be disposed over the semiconductor substrate 10. The planarized insulating layer 120 may be, for example, an insulating layer having an etching ratio different from that of the planarized protecting layer 115. The planarized insulating layer 120 may also be, for example, an insulating layer having the same etching ratio as that of the planarized protecting layer 115. The planarized protecting layer 115, in some embodiments, is an insulating layer having an etching ratio different from that of the planarized capping layer 110.

An interconnection layer pattern 138 is formed on the planarized capping layer 110, the planarized protecting layer 115, and the planarized insulating layer 120 with a positive shape while being in contact with the phase-change patterns 109. The interconnection layer pattern 138 may be, for example, a low resistance metal including aluminum (Al) except tungsten (W). The interconnection layer pattern 138 may also be configured with a negative shape being surrounded by an etching buffer layer and an etching stop layer patterns (not shown), which are sequentially stacked. The etching stop layer pattern may be an insulating layer having an etching ratio different from that of the etching buffer layer pattern. The interconnection layer pattern 138 is disposed to traverse the active regions 25.

Along a vertical line between one of the phase-change patterns 109, disposed at one side of the device isolation layer 20, and the active region 25, a lower contact hole plug 79, a buried layer pattern 89 and an upper contact hole plug 99 are sequentially disposed from a main surface of the semiconductor substrate 10. The lower contact hole plug 79 is in contact with the active region 25, while filling a lower contact hole 73, and concurrently surrounded by first and second interlayer insulating layers 60, 70. The lower contact hole plug 79 may comprise, for example, titanium nitride 75, and tungsten 77, which are sequentially stacked. The titanium nitride 75 conformably covers the lower contact hole 73. The buried layer pattern 89 is disposed so as to be in contact with the lower contact hole plug 79 and be concurrently surrounded by a third interlayer insulating layer 80. The buried layer pattern 89 may comprise titanium nitride 83 and tungsten 86, which are sequentially stacked. The titanium nitride layer 83 of the buried layer pattern 89 conformably covers sidewalls of the third interlayer insulating layer 80. The upper contact hole plug 99 fills an upper contact hole 93 and, concurrently, is in contact with the buried layer pattern 89 and the phase-change pattern 109. The upper contact hole plug 99 is disposed so as to be surrounded by a fourth interlayer insulating layer 90. The upper contact hole plug 99 may be titanium nitride. Further, an upper contact hole spacer 96 is disposed between the upper contact hole plug 99 and the fourth interlayer insulating layer 90. Likewise, component elements, which are the same as described above, are disposed along another vertical line from the main surface of the semiconductor substrate 10 on an opposite side to the device isolation layer 25.

Gate patterns 38 and gate nodes 58 are disposed on the main surface of the semiconductor substrate 10. The gate nodes 58 and the gate patterns 38 are located and spaced from their relevant lower contact hole plugs 79, respectively. Each of the gate patterns 38 comprises a gate 30 and a gate capping layer pattern 35. The gate patterns 38 are covered with the first interlayer insulating layer 60. The gate nodes 58 fill the gate node holes 54, respectively, which are disposed in the first interlayer insulating layer 60. Sidewalls of the gate patterns 38 are covered with gate spacers 50, respectively. Impurity ion regions 40 are disposed in the semiconductor substrate 10 while overlapping the gate patterns 38, respectively. The lower contact hole plugs 79 and the gate nodes 58 are in contact with the impurity ion regions 40, respectively.

Referring to FIGS. 2 and 4, in the cell structure of an MRAM 380, a device isolation layer 210 is disposed in a semiconductor substrate 200 to isolate two active regions 215. Magnetic tunnel junction patterns 319 are disposed over the active regions 215. The magnetic tunnel junction patterns 319, which may be three or more, may be disposed to correspond to the active regions 215 one to one. Each of the magnetic tunnel junction patterns 319 may comprise a magnetic tunnel junction layer pattern 313 and a magnetic tunnel junction layer node pattern 316, which are sequentially stacked. The magnetic tunnel junction layer node pattern 316 may be titanium nitride. The magnetic tunnel junction layer pattern 313 includes a ferromagnetic layer, a dielectric ($Al_2O_3$) layer, a spin fixed layer, and an anti-ferromagnetic layer stacked thereon. The anti-ferromagnetic layer may comprise a composite of platinum manganese ($Pt_xMn_y$). The spin fixed layer may be a composite of cobalt iron ($Co_xFe_y$). Alternatively, the spin fixed layer may be may comprise a composite of cobalt iron ($Co_xFe_y$), a ruthenium (Ru), and cobalt iron ($Co_xFe_y$), which are sequentially stacked. The ferromagnetic layer may be a composite of nickel iron ($Ni_xFe_y$). Pad layer patterns 310 are disposed under the magnetic tunnel junction patterns 319, respectively. Each of the pad layer patterns 310 is disposed to extend from one sidewall of the magnetic tunnel junction pattern 319 and is disposed so as to pass through at least one sidewall of the magnetic tunnel junction pattern 319. The pad layer pattern 310 may be titanium nitride.

A planarized capping layer 320, a planarized protecting layer 325, and a planarized insulating layer 330 are sequentially stacked on the semiconductor substrate 200 to surround sidewalls of the magnetic tunnel junction patterns 319. The planarized capping layer 320, the planarized protecting layer 325, and the planarized insulating layer 330 are disposed to conformably cover the sidewalls of the magnetic tunnel junction patterns 319, and to expose top surfaces of the magnetic tunnel junction patterns 319. On the contrary, only the planarized insulating layer 330, which surrounds the magnetic tunnel junction patterns 319, may be disposed over the semiconductor substrate 200. The planarized insulating layer 330 may be, for example, an insulating layer having an etching ratio different from that of the planarized protecting layer 325. The planarized insulating layer 330 may also be, for example, an insulating layer having the same etching ratio as that of the planarized protecting layer 325. The planarized protecting layer 325, in some embodiments, is an insulating layer having an etching ratio different from that of the planarized capping layer 320. An interconnection layer pattern 348 is formed on the planarized capping layer 320, the planarized protecting layer 325, and the planarized insulating layer 330 with a positive shape while being in contact with the magnetic tunnel junction patterns 319. The interconnection layer pattern 348 may be a low resistance metal including aluminum (Al) except tungsten (W). The interconnection layer pattern 348 may be configured with a negative shape being surrounded by an etching buffer layer and an etching stop layer pattern (not shown), which are sequentially stacked. The etching stop layer may be an insulating layer having an etching ratio different from that of the etching buffer layer. The interconnection layer pattern 348 is disposed to traverse the active regions 215.

Along a vertical line between one of the pad layer patterns 310, disposed at one side of the device isolation layer 210 and the active region 215, a lower contact hole plug 269, a buried layer pattern 279, a middle contact hole plug 289, a junction pattern 294 and an upper contact hole plug 309 are sequentially disposed on a main surface of the semiconductor substrate 200. The lower contact hole plug 269 is in contact with the active region 215, while filling a lower contact hole 263 and is concurrently surrounded by first and second interlayer insulating layers 250, 260. The lower contact hole plug 269 may comprise titanium nitride 265 and tungsten 267, which are sequentially stacked. The titanium nitride 265 conformably covers the lower contact hole 263. The buried layer pattern 279 is disposed so as to be in contact with the lower contact hole plug 269 and is concurrently surrounded by a third interlayer insulating layer 270. The buried layer pattern 279 may comprise titanium nitride 273 and tungsten 276, which are sequentially stacked. The titanium nitride 273 of the buried layer pattern 279 conformably covers sidewalls of the third interlayer insulating layer 270. The middle contact hole plug 289 fills a middle contact hole 283 and, concurrently, is in contact with the buried layer pattern 279. The middle contact hole plug 283 is disposed so as to be surrounded by a fourth interlayer insulating layer 280. The middle contact hole plug 289 may comprise titanium nitride 285 and tungsten 287, which are sequentially stacked. The titanium nitride 285 of the middle contact hole plug 289 conformably covers sidewalls of the fourth interlayer insulating layer 280.

The junction pattern 294 is disposed so as to be in contact with the middle contact hole plug 289 and is concurrently surrounded by a fifth interlayer insulating layer 290. A magnetic induction pattern 298 is disposed under the magnetic tunnel junction pattern 319 and is spaced apart from the junction pattern 294. The magnetic induction pattern 298 and the junction pattern 294 may be a low resistance metal, such as, for example, aluminum (Al) except tungsten (W). The upper contact hole plug 309 fills an upper contact hole 303 and, concurrently, is in contact with the junction pattern 294 and the pad layer pattern 310. The upper contact hole 303 is disposed so as to be surrounded by a six interlayer insulating layer 300. The upper contact hole plug 309 may comprise titanium nitride 305 and tungsten 307, which are sequentially stacked. The titanium nitride 305 of the upper contact hole plug 309 conformably covers sidewalls of the six interlayer insulating layer 300. Likewise, component elements, which are the same as described above, are disposed along another vertical line from the main surface of the semiconductor substrate 100 on an opposite side to the device isolation layer 210.

Gate patterns 228 and gate nodes 258 are disposed on the main surface of the semiconductor substrate 200. The gate nodes 258 and the gate patterns 228 are located so as to be spaced from their relevant lower contact hole plugs 269, respectively. Each of the gate patterns 228 comprises a gate 220 and a gate capping layer pattern 225. The gate patterns 228 are covered with the first interlayer insulating layer 250. The gate nodes 258 fill the gate node holes 254 respectively, which are disposed in the first interlayer insulating layer 250. Sidewalls of the gate patterns 228 are covered with gate spacers 240, respectively. Impurity ion regions 230 are disposed in the semiconductor substrate 200, while overlapping the gate patterns 228, respectively. The lower contact hole plugs 269 and the gate nodes 258 are in contact with the impurity ion regions 230, respectively.

Methods of forming semiconductor devices having a planarized insulating layer, according to some embodiments of the invention, will now be explained.

FIGS. 5 through 11 are sectional views illustrating methods of forming a semiconductor device taken along line I-I' of FIG. 1, respectively, according to some embodiments of the present invention.

Figure 5:
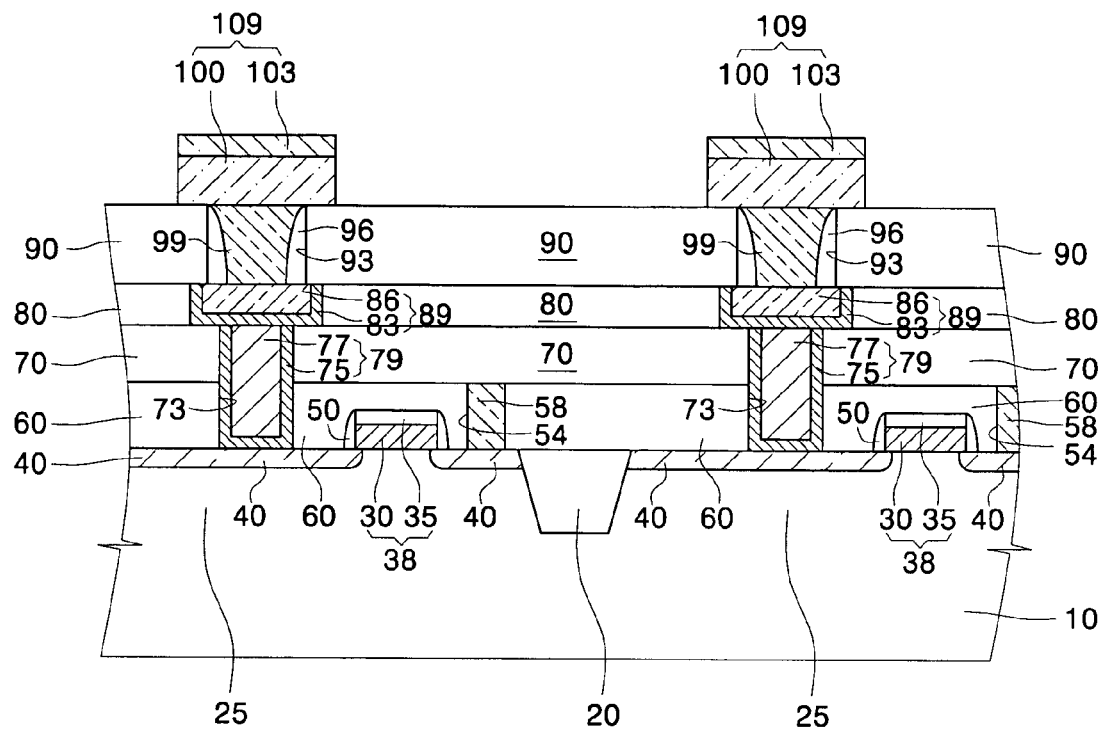
FIGS. 5 through 11 are sectional views illustrating methods of forming a semiconductor device taken along line I-I' of FIG. 1, respectively, in accordance with some embodiments of the present invention.

Referring to FIGS. 1 and 5, a device isolation layer 20 is formed in a semiconductor substrate 10, while isolating two active regions 25. A gate pattern 38 is formed on the semiconductor substrate 10 of the active region 25 at one side of the device isolation layer 20. The gate pattern 38 is formed by using a gate 30 and a gate capping layer pattern 35, which are sequentially stacked. Impurity ion regions 40 are formed in the semiconductor substrate 10 to overlap the gate patterns 30.

Gate spacers 50 are formed to cover sidewalls of the gate patterns 38. A first interlayer insulating layer 60 is formed on the semiconductor substrate 10 to cover the gate patterns 38 and the gate spacers 50. A gate node hole 54 is formed to penetrate the first interlayer insulating layer 60, thereby exposing one of the impurity ion regions 40. The gate node hole 54 is filled with a gate node 58. The first interlayer insulating layer 60 may be formed by using an insulating layer having an etching ratio different from that of the device isolation layer 20.

A second interlayer insulating layer 70 is formed to cover the first interlayer insulating layer 60 and the gate node 58. A lower contact hole 73 is formed to penetrate the second interlayer insulating layer 70, thereby exposing the remaining impurity ion regions 40. A lower contact hole plug 79 is formed to fill the lower contact hole 73. The lower contact hole plug 79 may be formed using titanium nitride (TiN) 75 and tungsten (W) 77. The titanium nitride 75 conformably covers sidewalls of the lower contact hole 73. The second interlayer insulating layer 70 may be formed by using an insulating layer having the same etching ratio as that of the first interlayer insulating layer 60.

A third interlayer insulating layer 80 is formed to cover the lower contact hole plug 79 and the second interlayer insulating layer 70. A buried layer pattern 89 is formed in the third interlayer insulating layer 80 and is in contact with the lower contact hole plug 79. The buried layer pattern 89 may be formed using a titanium nitride 83 and tungsten 86, which are sequentially stacked. The titanium nitride 83 of the buried layer pattern 89 covers sidewalls of the third interlayer insulating layer 80. The third interlayer insulating layer 80 may be formed by using an insulating layer having an etching ratio different from that of the second interlayer insulating layer 70.

A fourth interlayer insulating layer 90 is formed to cover the buried layer pattern 89 and the third interlayer insulating layer 80. An upper contact hole 93 is formed in the fourth interlayer insulating layer 90. The upper contact hole 93 is formed so as to be filled with an upper contact hole spacer 96 and an upper contact hole plug 99. The upper contact hole plug 99 may be formed using titanium nitride. The upper contact hole spacer 96 may be formed by using an insulating layer having an etching ratio different from that of the fourth interlayer insulating layer 90. The fourth interlayer insulating layer 90 may be formed by using an insulating layer having an etching ratio different from that of the third interlayer insulating layer 80.

A phase-change pattern 109 is formed on the fourth interlayer insulating layer 90 so as to be in contact with the upper contact hole plug 99. The phase-change pattern 109 may be formed by using a phase-change layer pattern 100 and a phase-change layer node pattern 103, which are sequentially stacked. The phase-change layer node pattern 103 may be formed by using titanium nitride. The phase-change layer pattern 100 may be formed by using a composite comprising, for example, germanium, selenium, and/or tellurium ($Ge_xSe_yTe_z$).

Likewise, component elements, which are the same as described above, are disposed on the semiconductor substrate 10 of the active region 25 as well as the impurity ion region 40 opposite to the device isolation layer 20.

Figure 6:
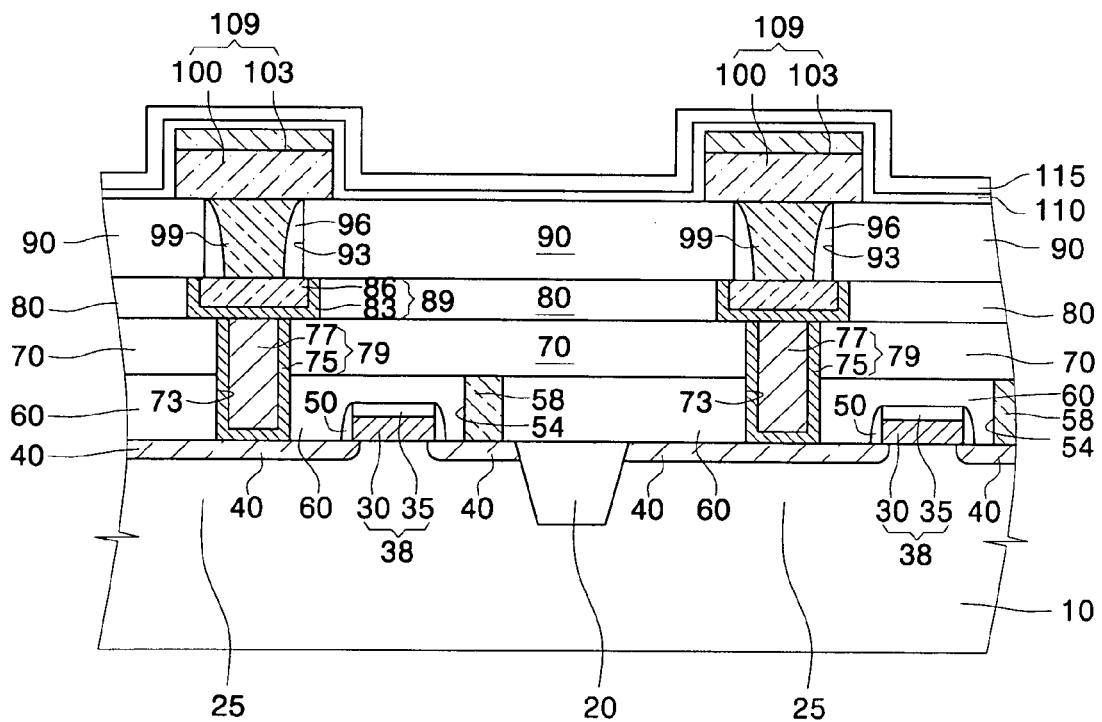
Figure 7:
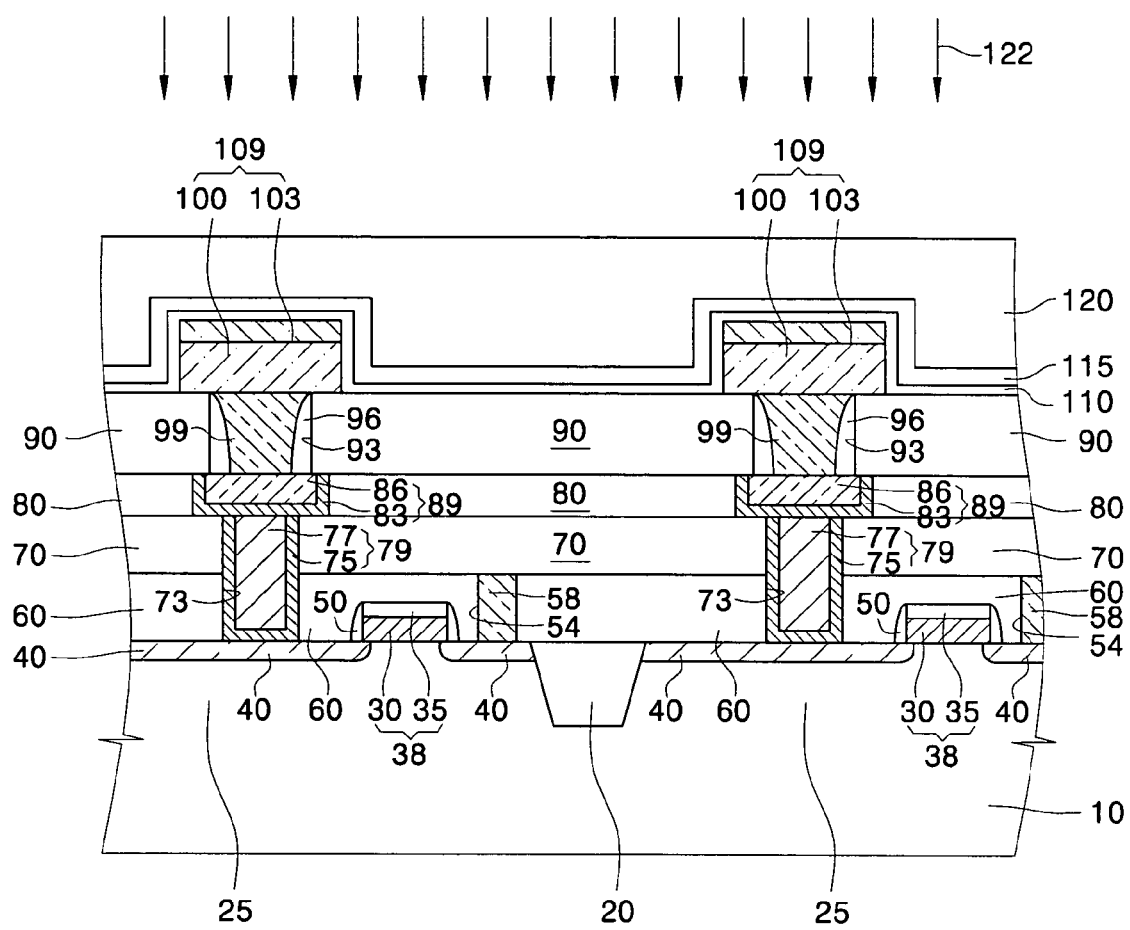

Referring to FIGS. 1, 6 and 7, a planarized capping layer 110 and a planarized protecting layer 115 are sequentially formed to cover the phase-change patterns 109. The planarized protecting layer 115 may be formed by using an insulating layer having an etching ratio different from that of the planarized capping layer 110. The planarized capping layer 110 may be formed by using silicon nitride ($Si_3N_4$). The planarized capping layer 110 may be formed by performing a CVD (chemical vapor deposition) process or an ALD (atomic layer deposition) process. The planarized protecting layer 115 may be formed by using silicon oxide ($SiO_2$).

A planarized insulating layer 120 is formed to cover the planarized protecting layer 115. The planarized insulating layer 120 may be formed by using an insulating layer having an etching ratio different from that of the planarized protecting layer 115. The planarized insulating layer 120 may be an insulating layer having the same etching ratio as that of the planarized protecting layer 115. A first planarization process 122 is performed on the planarized insulating layer 120. The first planarization process 122 may be performed to have an etching ratio with respect to the planarized insulating layer 120 and the planarized protecting layer 115. The first planarization process 122 can be performed by using a chemical mechanical polishing (CMP) or an etching back technique.

Figure 8:
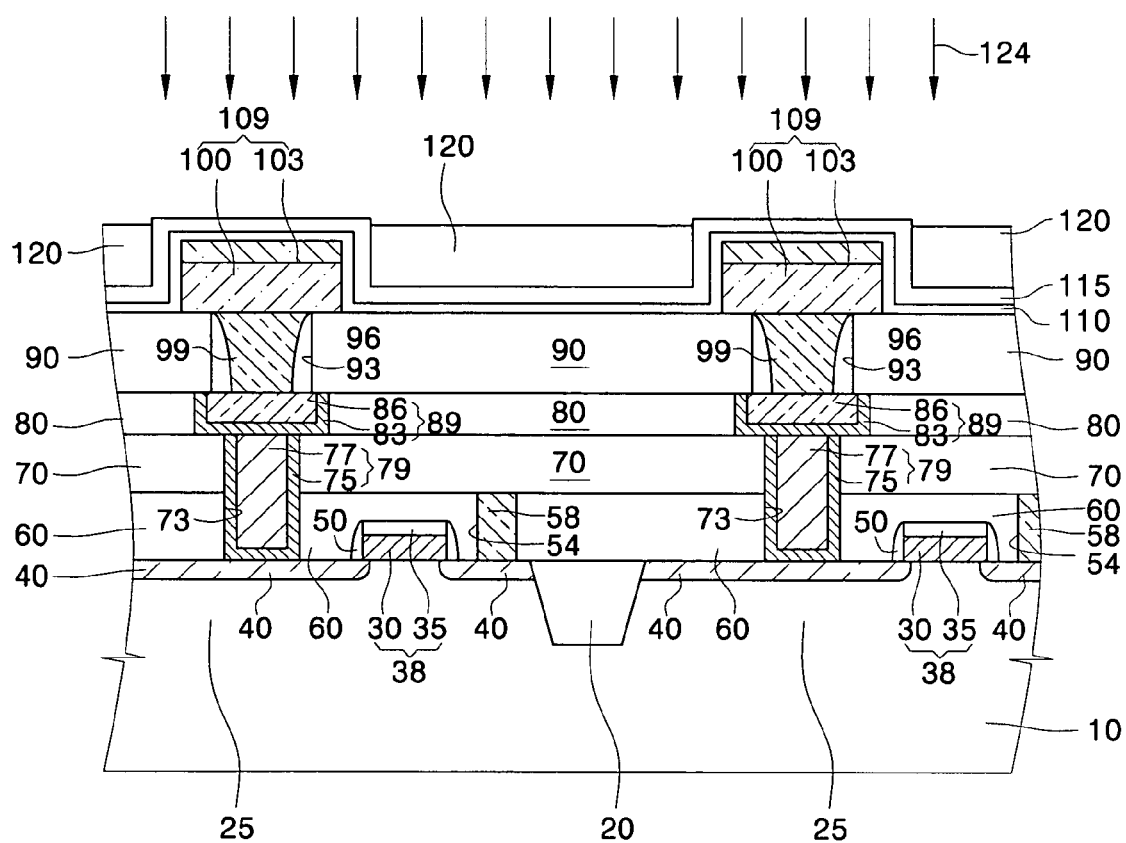
Figure 9:
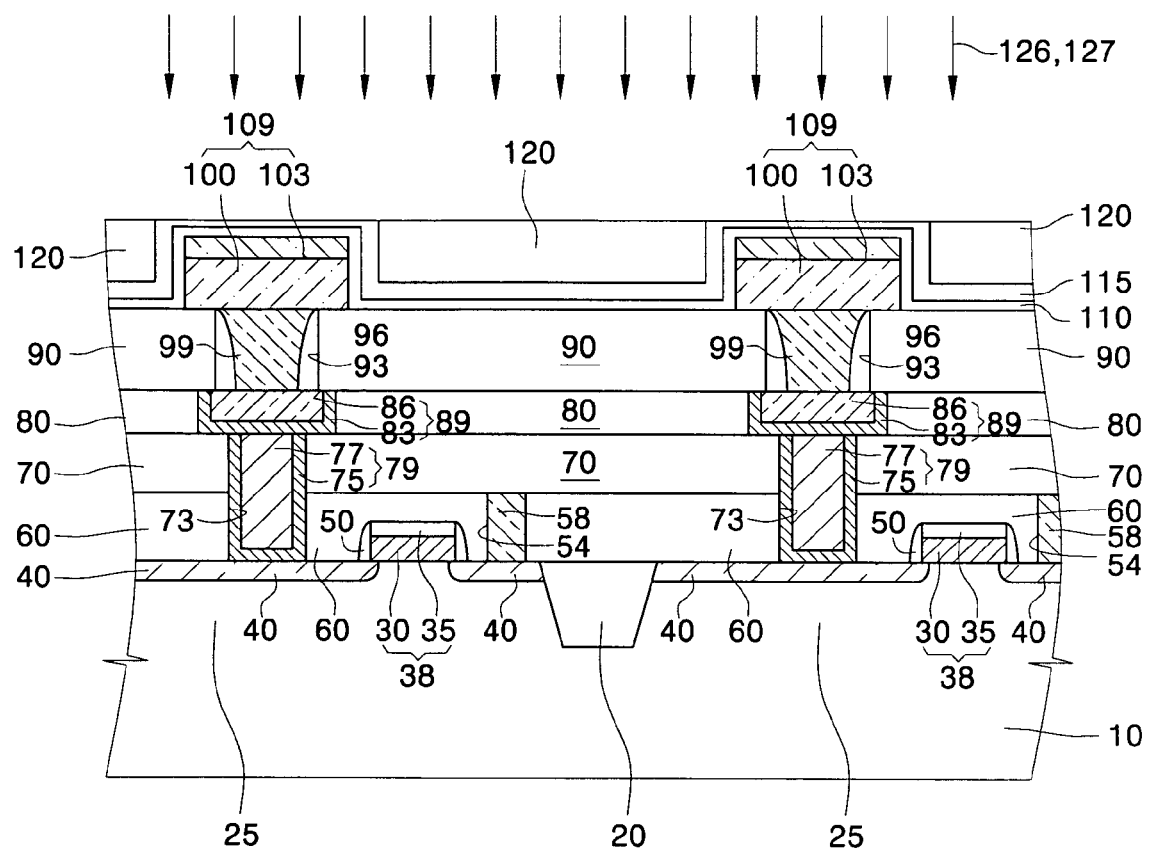

Referring to FIGS. 1, 8 and 9, the first planarization process 122 is performed on the planarized insulating layer 120, thereby exposing the planarized protecting layer 115. A second planarization process 124 is sequentially performed on the planarized insulating layer 120 and the planarized protecting layer 115. The second planarization process 124 may be performed so as to have an etching ratio with respect to the planarized protecting layer 115 and the planarized insulating layer 120 over the planarized capping layer 110. The second planarization process 124 may be performed by using a CMP or an etching back technique.

The second planarization process 124 is performed on the planarized insulating layer 120 and the planarized protecting layer 115, thereby exposing the planarized capping layer 110. By using the planarized protecting layer 115 and the planarized insulating layer 120 as an etching mask, a first wet etching process 126 is performed on the planarized capping layer 110. The first wet etching process 126 removes the planarized capping layer 110 on the phase-change patterns 109. The first wet etching process 126 may be performed by using phosphoric acid ($H_3PO_4$).

By using the planarized capping layer 110 and the phase-change patterns 109 as an etching mask, a second wet etching process 127 is sequentially performed on the planarized insulating layer 120 and the planarized protecting layer 115. The second wet etching process 127 can be performed by using hydrofluoric acid (HF).

Figure 10:
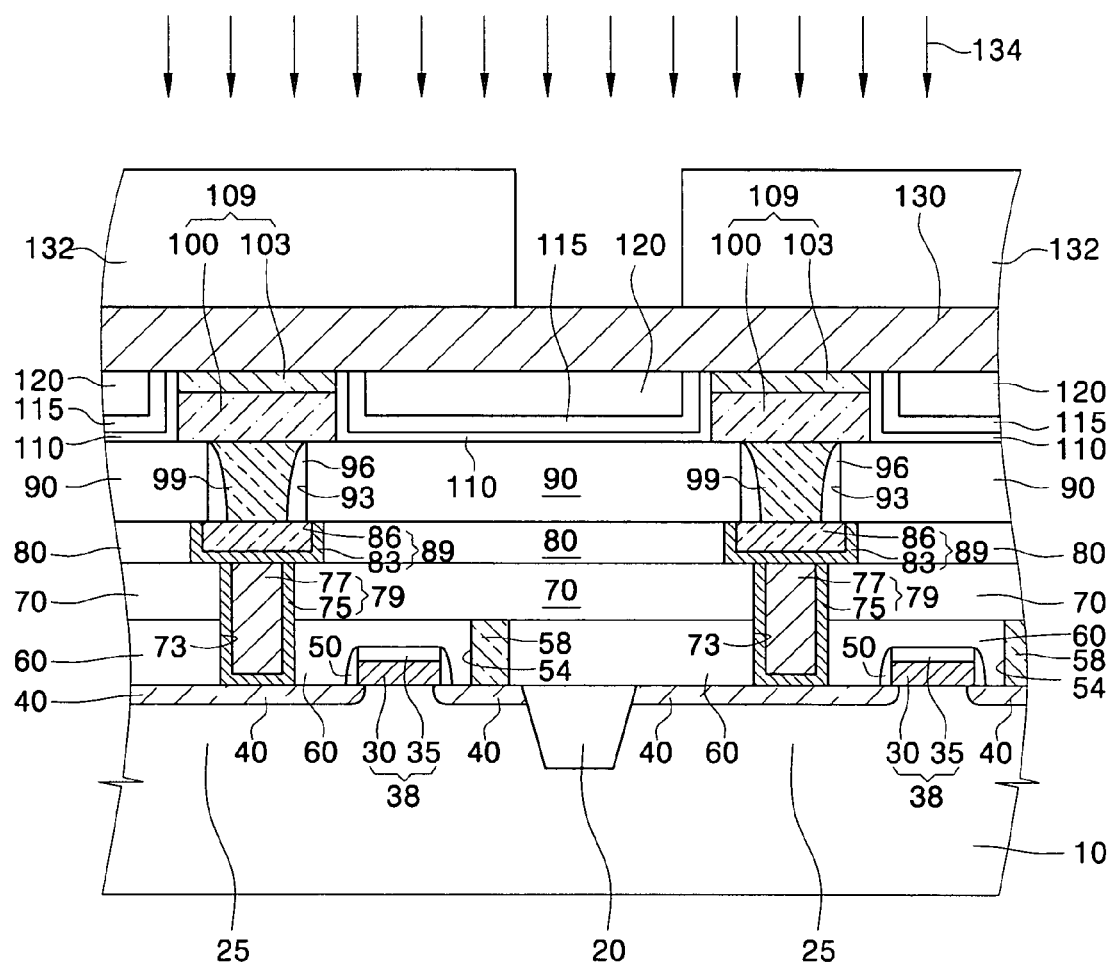
Figure 11:
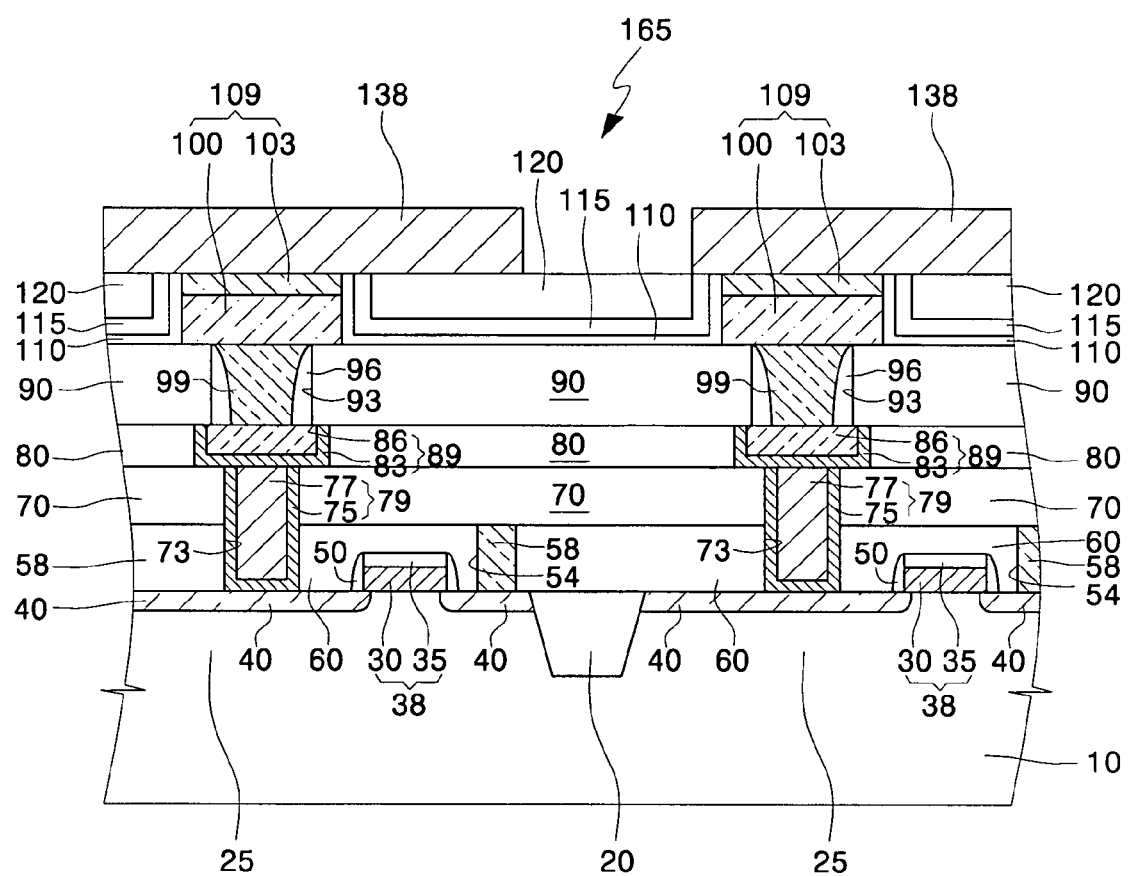

Referring to FIGS. 1, 10, and 11, the second wet etching process 127 partially removes the planarized protecting layer 115 and the planarized insulating layer 120. Through the first and the second wet etching processes 126, 127, the phase-change patterns 109 have about the same surface level as those of the planarized capping layer 110, the planarized protecting layer 115, and the planarized insulating layer 120. An interconnection layer 130 is formed to cover the planarized capping layer 110, the planarized protecting layer 115, the planarized insulating layer 120, and the phase-change patterns 109. The interconnection layer 130 may be formed by using a low-resistance metal, such as, for example, aluminum (Al) except tungsten (W).

Photoresist patterns 132 are formed on the interconnection layer 130. The photoresist patterns 132 may be formed to overlap the phase-change patterns 109, respectively. A dry etching process 134 may be performed on the interconnection layer 130 by using the photoresist pattern 132 as an etching mask. The dry etching process 134 may be performed to have an etching ratio with respect to the interconnection layer 130 over the planarized capping layer 110, the planarized protecting layer 115, the planarized insulating layer 120, and the phase-change patterns 109. By the dry etching process 134, an interconnection layer pattern 138 may be formed with a positive shape on the planarized capping layer 110, the planarized protecting layer 115, and the planarized insulating layer 120. As a result, a cell of the phase-change random access memory (PRAM) 165, in which the phase-change patterns 109 and the interconnection layer pattern 138 are directly in contact, is formed.

FIGS. 12 through 15 are sectional views illustrating methods of forming a semiconductor device taken along line I-I' of FIG. 1, respectively, in accordance with further embodiments of the present invention.

Like numerals refer to like elements in FIGS. 12 through 15 and FIGS. 5 through 11. In some embodiments, a formation of component elements until exposing phase-change patterns 109 on the semiconductor substrate 10 uses the methods according to embodiments of the invention described with reference to FIGS. 5 through 9.

Figure 12:
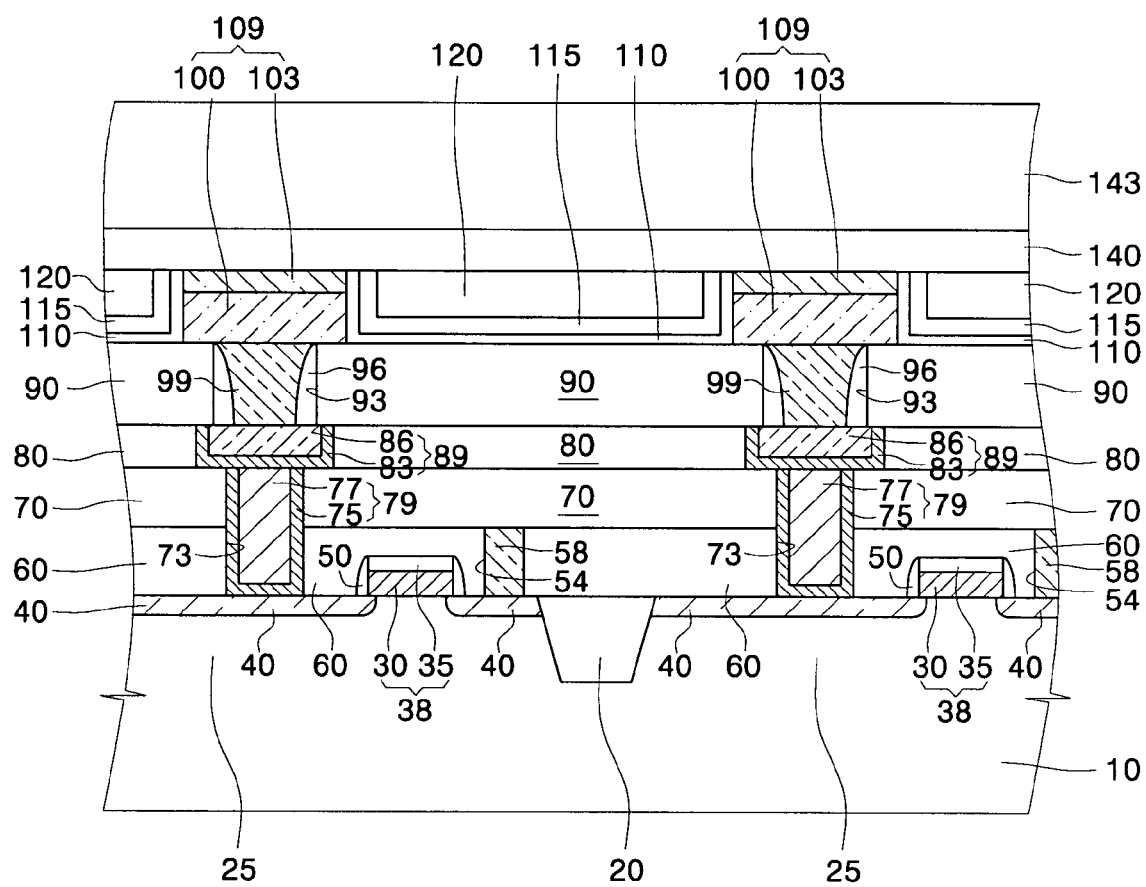
FIGS. 12 through 15 are sectional views illustrating further methods of forming a semiconductor device taken along line I-I' of FIG. 1, respectively, in accordance with some embodiments of the present invention.
Figure 13:
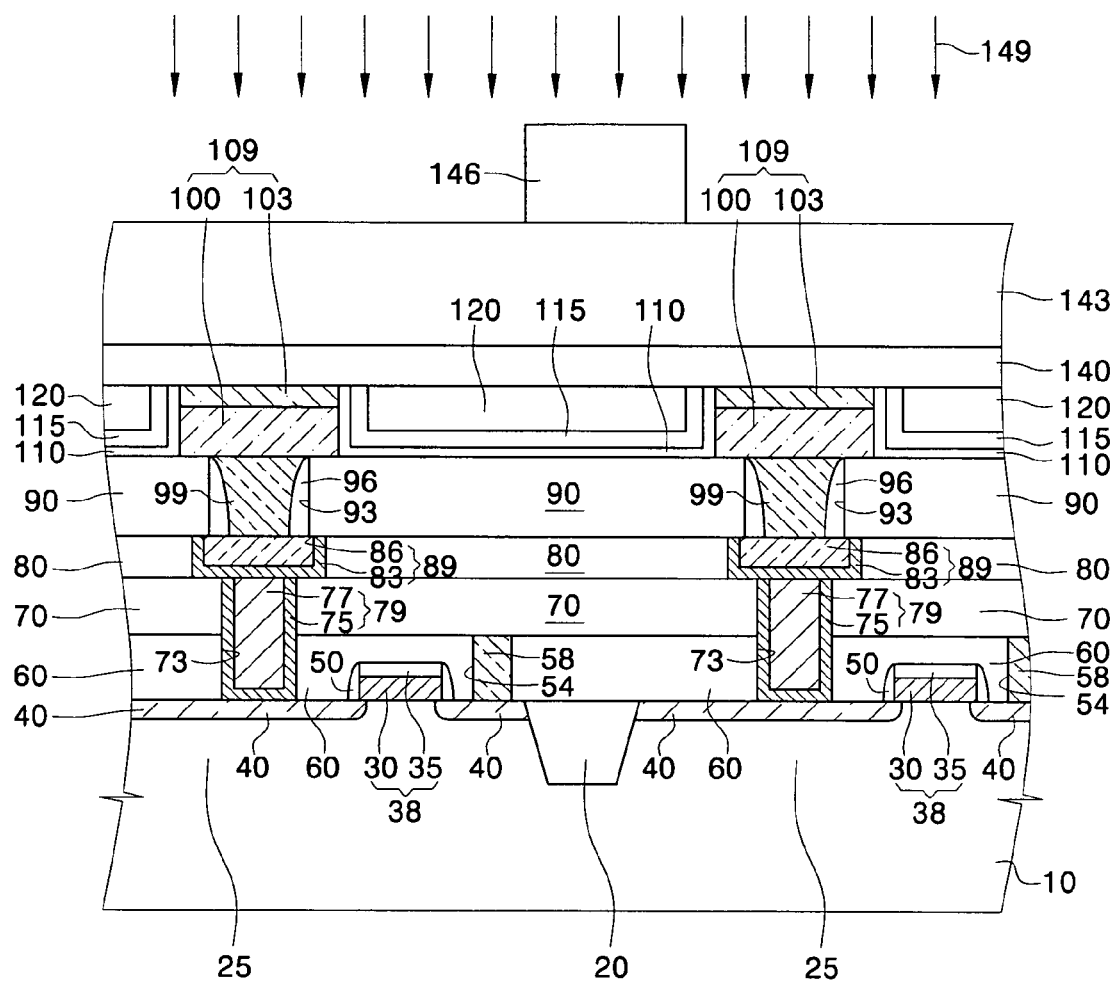

Referring to FIGS. 1, 12, and 13, the phase-change patterns 109 are exposed by using the planarized capping layer 110, the planarized protecting layer 115, and the planarized insulating layer 120. An etching buffer layer 140 and an etching stop layer 143 are formed to cover the phase-change patterns 109, the planarized capping layer 110, the planarized protecting layer 115, and the planarized insulating layer 120. The etching stop layer 143 is formed by using an insulating layer having an etching ratio different from that of the etching buffer layer 140.

A photoresist pattern 146 is formed on the etching stop layer 143 to expose the phase-change patterns 109. By using the photoresist pattern 146 as an etching mask, a dry etching process 149 is sequentially performed on the etching stop layer 143 and the etching buffer layer 140.

Figure 14:
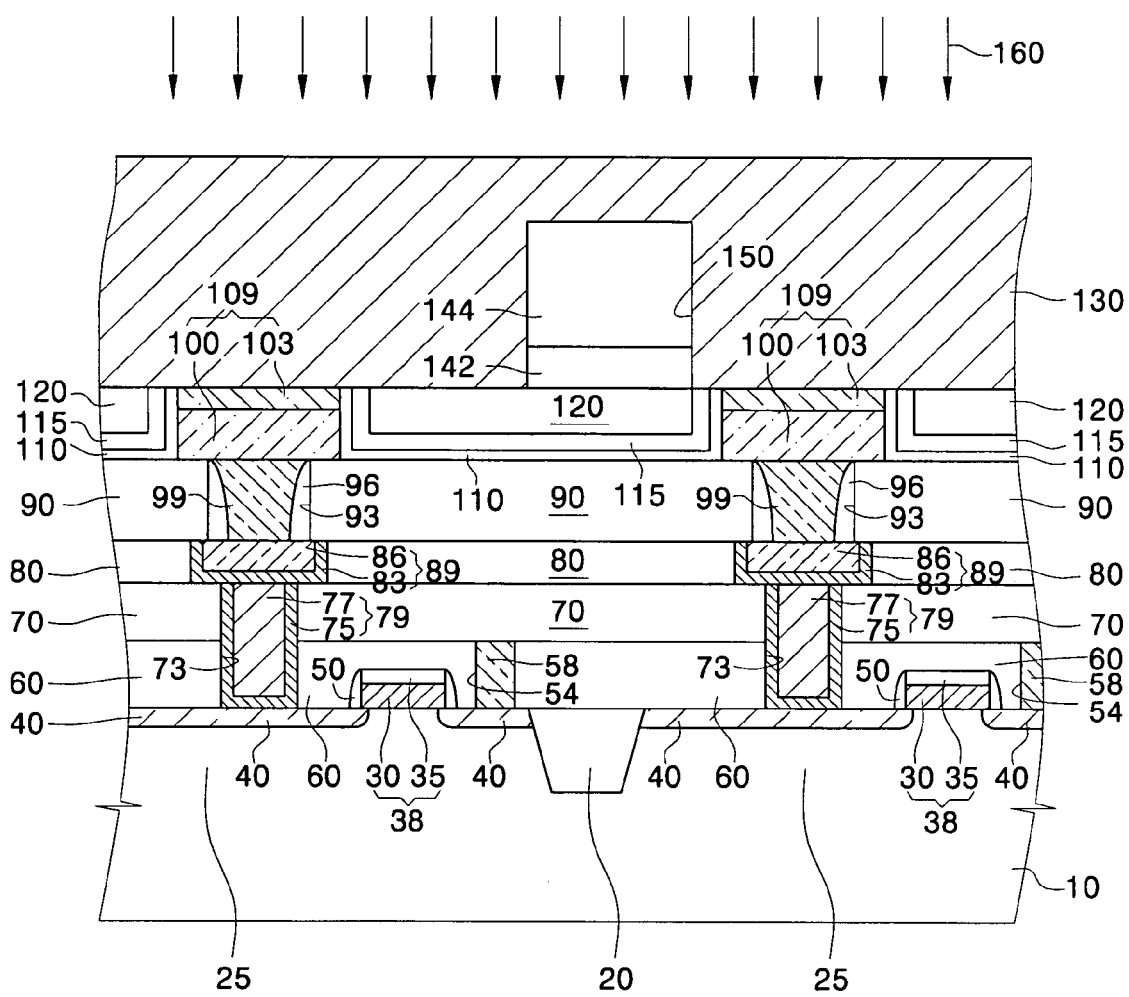
Figure 15:
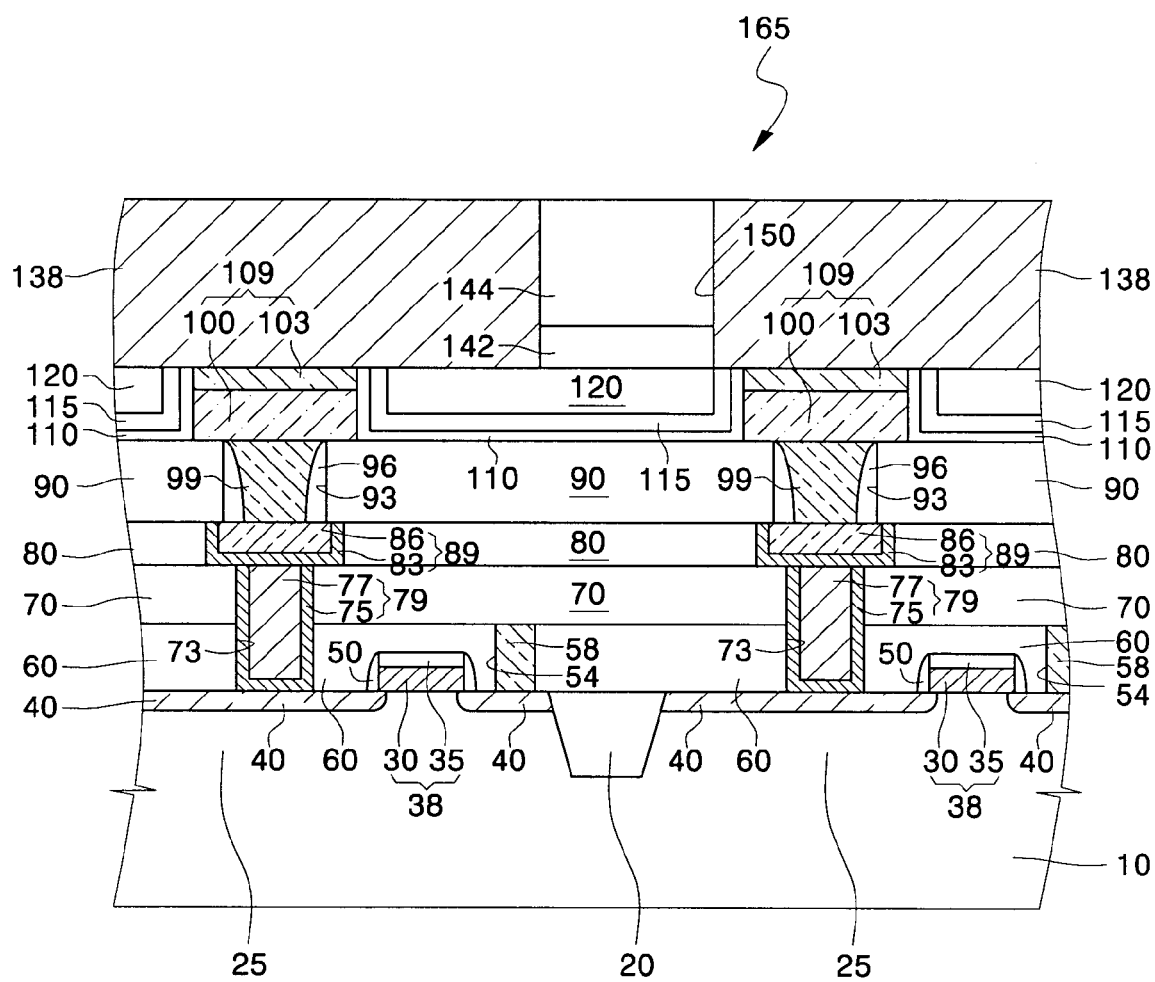

Referring to FIGS. 1, 14, and 15, the dry etching process 149 forms an etching buffer layer and etching stop layer patterns 142, 144, which are sequentially stacked. A trench 150, which has a predetermined depth, is formed in the etching buffer layer and etching stop layer patterns 142, 144. Thus, the etching buffer layer and etching stop layer patterns 142, 144 expose the phase-change patterns 109 through the trench 150.

An interconnection layer 130 is formed to fill the trench 150 and concurrently cover an upper surface of the etching stop layer pattern 144. The interconnection layer 130 may be formed by using a low resistance metal, such as, for example, aluminum (Al) except tungsten (W). A planarization process 160 is performed on the interconnection layer 130 so as to expose the etching stop layer pattern 144. By the planarization process 160, an interconnection layer pattern 138 is formed with a negative shape, while isolating the etching buffer layer and etching stop layer patterns 142, 144. The planarization process 160 can be performed by using a CMP technique. The planarization process 160 may be performed to have an etching ratio with respect to the interconnection layer 130 over the etching stop layer 44. As a result, the cell of a PRAM 165 is formed in which the phase-change patterns 109 and the interconnection layer pattern 138 are directly in contact with each other.

FIGS. 16 through 19 are sectional views illustrating methods of forming a semiconductor device taken along line of I-I' FIG. 1, respectively, in accordance with further embodiments of the present invention.

Like numerals refer to like elements in FIGS. 16 through 19 and FIGS. 5 through 11. In some embodiments, a formation of component elements until exposing phase-change patterns 109 on the semiconductor substrate 10 uses the methods according to embodiments of the invention described with reference to FIG. 5.

Figure 16:
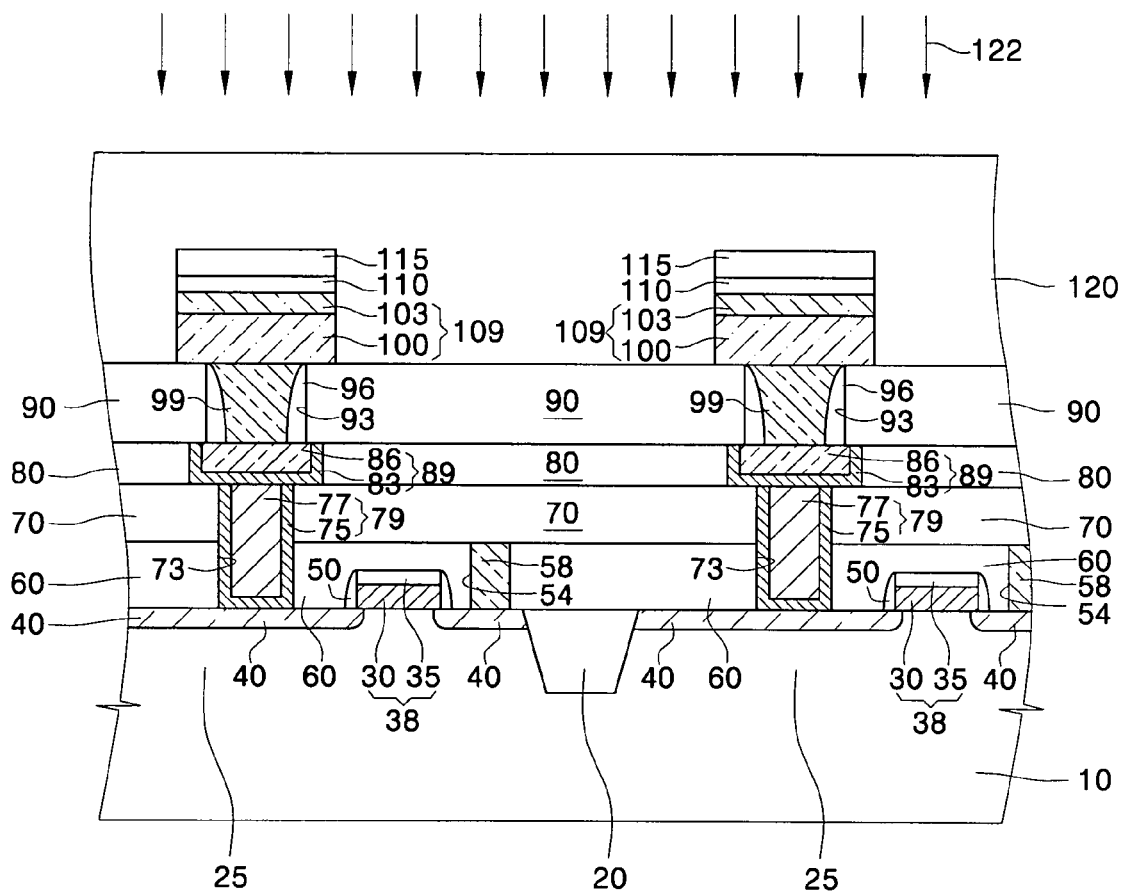
FIGS. 16 through 19 are sectional views illustrating further methods of forming a semiconductor device taken along line of I-I' FIG. 1, respectively, in accordance with some embodiments of the present invention.
Figure 17:
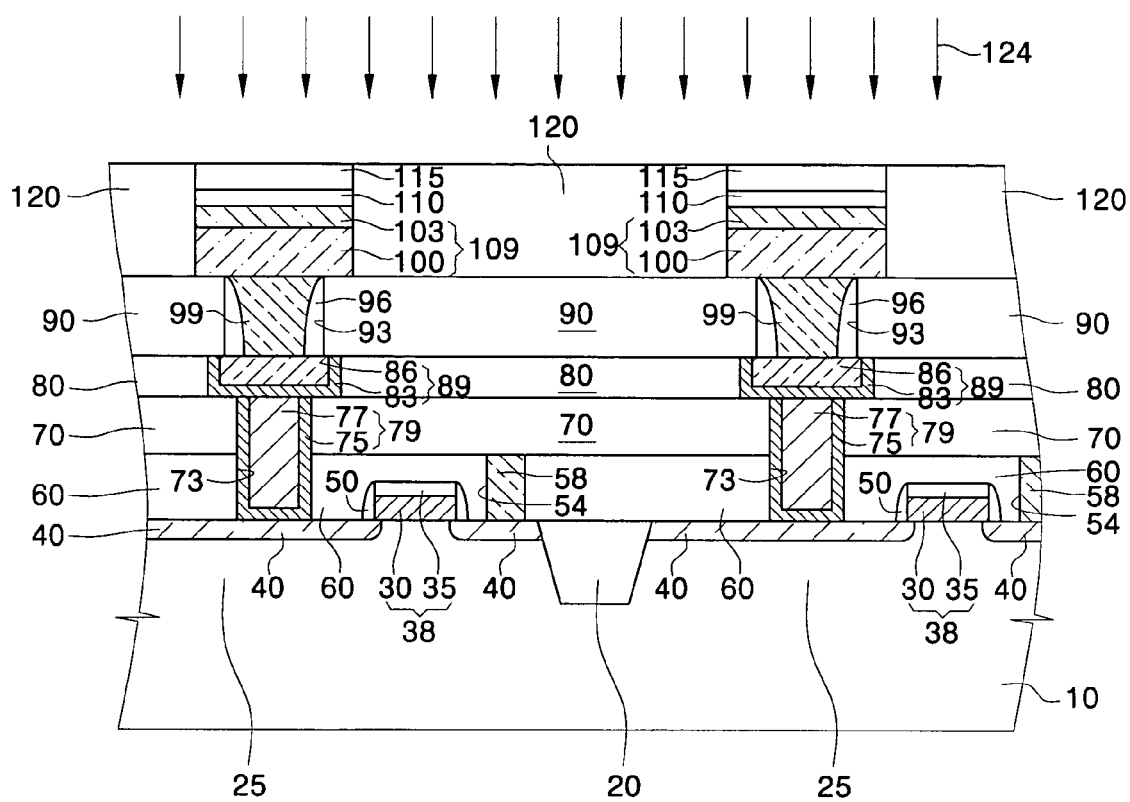

Referring to FIGS. 1, 16, and 17, a planarized capping layer 110 and a planarized protecting layer 115 are sequentially formed on each of the phase-change patterns 109. A planarized insulating layer 120 is sufficiently formed to cover the planarized protecting layer 115, the planarized capping layer 110, and the phase-change patterns 109. A first planarization process 122 is performed on the planarized insulating layer 120. The first planarization process 122 may be performed to have an etching ratio with respect to the planarized insulating layer 120 over the planarized protecting layer 115. The first planarization process 122 can be performed by using a CMP or an etching back technique.

The first planarization process 122 is performed to expose the planarized protecting layers 115 by using the planarized insulating layer 120. A second planarization process 124 is sequentially performed on the planarized protecting layers 115 and the planarized insulating layer 120. The second planarization process 124 may be performed to have an etching ratio with respect to the planarized protecting layers 115 over the planarized capping layers 110. The second planarization process 124 can be performed by using a CMP or an etching back technique.

Figure 18:
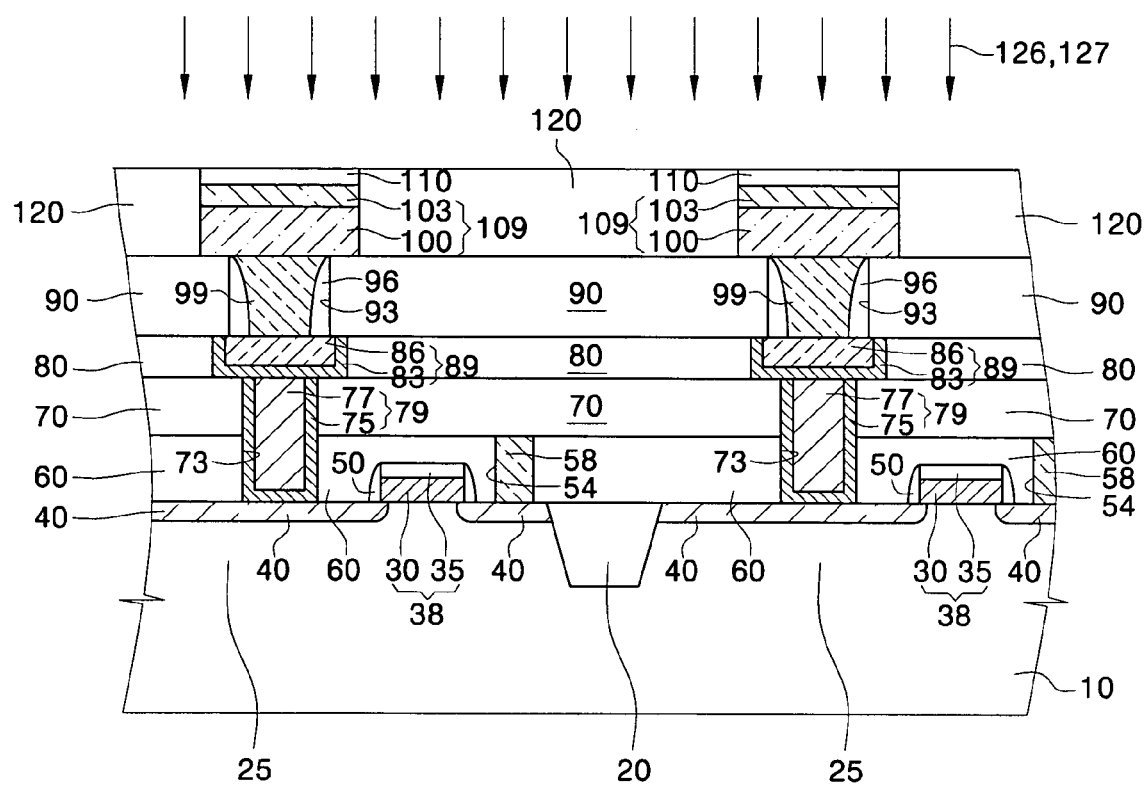
Figure 19:
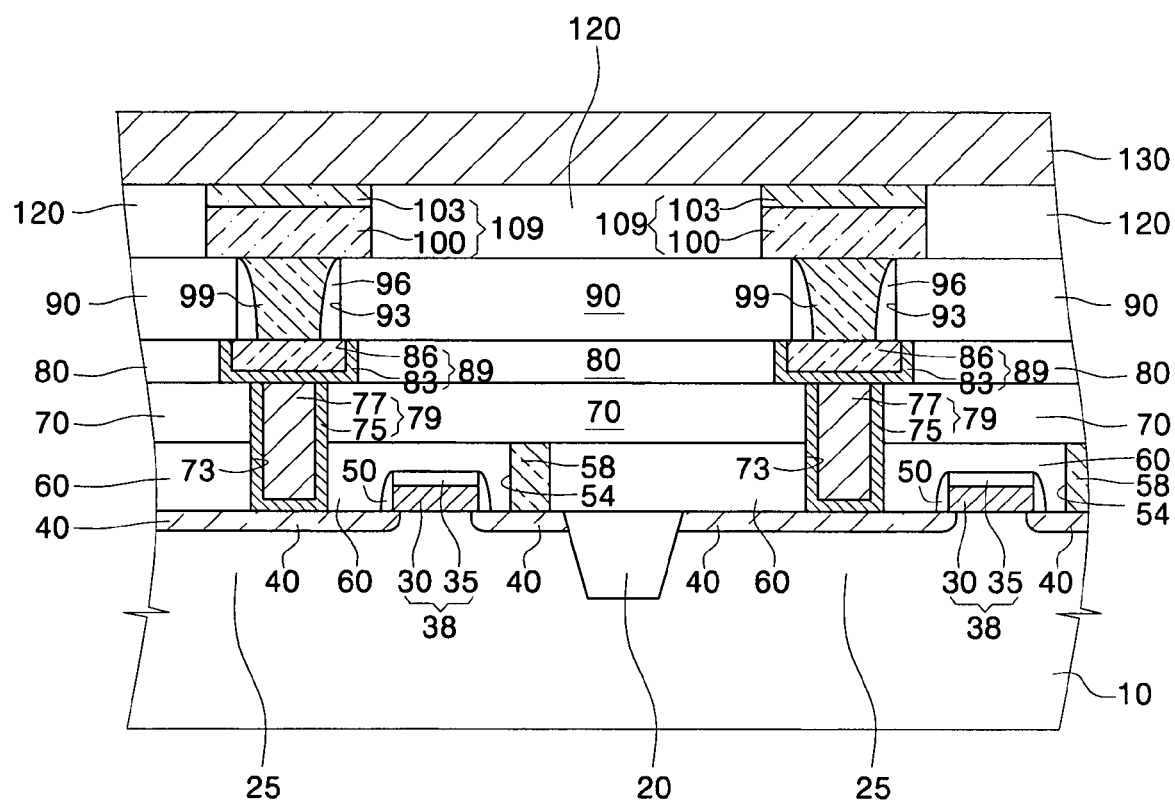

Referring to FIGS. 1, 18, and 19, the second planarization process 124 is performed on the planarized insulating layer 120, thereby exposing the planarized capping layers 110. By using the planarized insulating layer 120 as an etching mask, a first wet etching process 126 is performed on the planarized capping layers 110. By the first wet etching process 126, the planarized capping layer 110 on each of the phase-change patterns 109 is removed. The first wet etching process 126 can be performed by using phosphoric acid ($H_3PO_4$).

A second wet etching process 127 is performed on the planarized insulating layer 120 by using the phase-change patterns 109 as an etching mask. The second wet etching process 127 can be performed by using hydrofluoric acid (HF). An interconnection layer 130 is formed to cover the planarized insulating layer 120 and the phase-change patterns 109. The interconnection layer 130 may be formed by using a metal, such as, for example, aluminum (Al) except tungsten (W). Hereafter, an interconnection layer pattern 138, which has a positive shape and is directly in contact with the phase-change patterns 109, may be formed as described in reference to FIGS. 10 and 11. Alternatively, an interconnection layer pattern 138, which has a negative shape and is directly in contact with the phase-change patterns 109, may be formed as described in reference to FIGS. 12 through 15.

FIGS. 20 through 27 are sectional views illustrating methods of forming a semiconductor device taken along line II-II' of FIG. 2, respectively, in accordance with further embodiments of the present invention.

Figure 20:
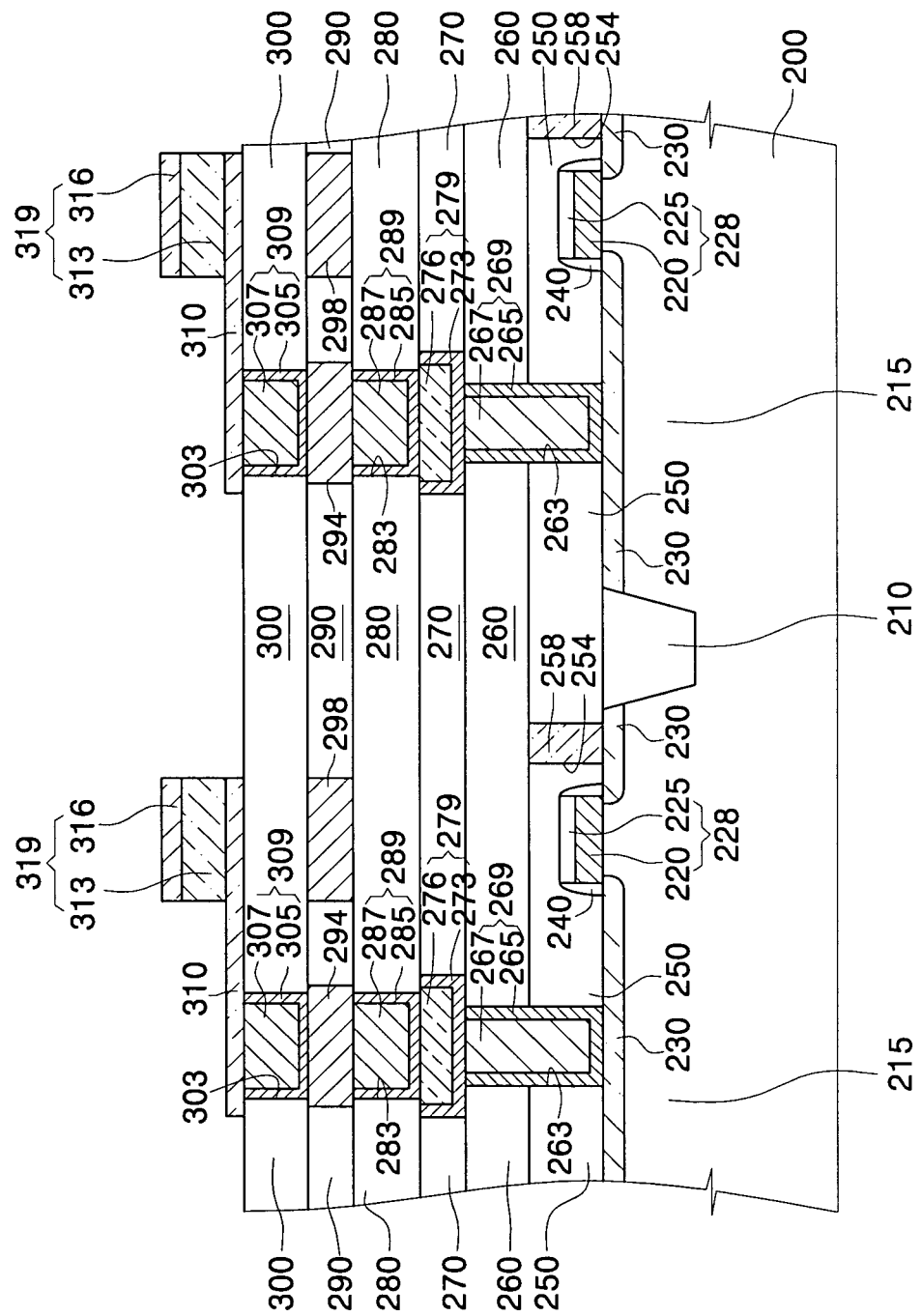
FIGS. 20 through 27 are sectional views illustrating methods of forming a semiconductor device taken along line II-II' of FIG. 2, respectively, in accordance with some embodiments of the present invention.

Referring to FIGS. 2 and 20, a device isolation layer 210 is formed in a semiconductor substrate 200, while isolating two active regions 215. A gate pattern 228 is formed on the semiconductor substrate 200 of the active region 215 at one side of the device isolation layer 210. The gate pattern 228 is formed using a gate 220 and a gate capping layer pattern 225, which are sequentially stacked. Impurity ion regions 230 are formed in the semiconductor substrate 200 to overlap the gate pattern 228.

Gate spacers 240 are formed to cover sidewalls of the gate patterns 228, respectively. A first interlayer insulating layer 250 is formed on the semiconductor substrate 200 to cover the gate pattern 228 and the gate spacers 240. A gate node hole 254 is formed to penetrate the first interlayer insulating layer 250, thereby exposing one of the impurity ion regions 230. The gate node hole 254 is filled with a gate node 258. The first interlayer insulating layer 250 may be formed by using an insulating layer having an etching ratio different from that of the device isolation layer 210.

A second interlayer insulating layer 260 is formed to cover the first interlayer insulating layer 250 and the gate node 258. A lower contact hole 263 is formed to penetrate the second interlayer insulating layer 260, thereby exposing the remaining the impurity ion regions 230. A lower contact hole plug 269 is formed to fill the lower contact hole 263. The lower contact hole plug 269 may be formed by using titanium nitride (TiN) 265 and/or tungsten (W) 267. The titanium nitride 265 conformably covers sidewalls of the lower contact hole 263. The second interlayer insulating layer 260 may be formed by using an insulating layer having the same etching ratio as that of the first interlayer insulating layer 250.

A third interlayer insulating layer 270 is formed to cover the lower contact hole plug 269 and the second interlayer insulating layer 260. A buried layer pattern 279 is formed in the third interlayer insulating layer 270 and is in contact with the lower contact hole plug 269. The buried layer pattern 279 may be formed by using titanium nitride 273 and/or tungsten 276, which are sequentially stacked. The titanium nitride 273 of the buried layer pattern 279 covers sidewalls of the third interlayer insulating layer 270. The third interlayer insulating layer 270 may be formed by using an insulating layer having an etching ratio different from that of the second interlayer insulating layer 260.

A fourth interlayer insulating layer 280 is formed to cover the buried layer pattern 279 and the third interlayer insulating layer 270. A middle contact hole 283 is formed in the fourth interlayer insulating layer 280. The middle contact hole 283 is formed so as to be filled with the middle contact hole plug 289. The middle contact hole plug 289 may be formed by using titanium nitride 285 and/or tungsten 287. The titanium nitride 285 of the middle contact hole plug 289 conformably covers sidewalls of the fourth interlayer insulating layer 280. The fourth interlayer insulating layer 280 may be formed using an insulating layer having an etching ratio different from that of the third interlayer insulating layer 270.

After the middle contact hole plug 289 is formed, a fifth interlayer insulating layer 290 is formed to cover the fourth interlayer insulating layer 280. A junction pattern 294 and a magnetic induction pattern 298 are formed concurrently in the fifth interlayer insulating layer 290. The magnetic induction pattern 298 and the junction pattern 294 are formed by using a metal having a low resistance, such as, for example, aluminum (Al) except tungsten (W). The fifth interlayer insulating layer 290 may be formed by using an insulating layer having an etching ratio different from that of the fourth interlayer insulating layer 280.

A sixth interlayer insulating layer 300 is formed to cover the fifth interlayer insulating layer 290 as well as the junction pattern 294 and the magnetic induction pattern 298. An upper contact hole 303 is formed in the sixth interlayer insulating layer 300. The upper contact hole 303 is formed so as to be filled with an upper contact hole plug 309. The upper contact hole plug 309 may be formed by using titanium nitride 305 and/or tungsten 307. The titanium nitride 305 of the upper contact hole plug 309 conformably covers sidewalls of the sixth interlayer insulating layer 300. The sixth interlayer insulating layer 300 may be formed by using an insulating layer having an etching ratio different from that of the fifth interlayer insulating layer 290.

After the upper contact hole plug 309 is formed, a pad layer pattern 310 is formed on the sixth interlayer insulating layer 300. The pad layer pattern 310 is formed so as to be in contact with the upper contact hole plug 309 while overlapping the magnetic induction pattern 298. The pad layer pattern 310 is formed by using titanium nitride. A magnetic tunnel junction pattern 319 is formed on the pad layer pattern 310 so as to be located over the magnetic induction pattern 298. The magnetic tunnel junction pattern 319 may be formed by using a magnetic tunnel junction layer pattern 313 and a magnetic tunnel junction layer node pattern 316, which are sequentially stacked. The magnetic tunnel junction layer node pattern 316 may be formed by using titanium nitride. The magnetic tunnel junction layer pattern 313 may be formed by using a ferromagnetic layer, a dielectric ($Al_2O_3$) layer, a spin fixed layer, and/or an anti-ferromagnetic layer. The anti-ferromagnetic layer may be formed by using a composite of platinum manganese ($Pt_xMn_y$). The spin fixed layer may be formed by using a composite of cobalt iron ($Co_xFe_y$). Alternatively, the spin fixed layer may be formed by using a composite of cobalt iron ($Co_xFe_y$), ruthenium (Ru), and/or cobalt iron ($Co_xFe_y$), which are sequentially stacked. The ferromagnetic layer is formed by using a composite of nickel iron ($Ni_xFe_y$).

Likewise, component elements, which are the same as described above, are disposed on the semiconductor substrate 200 of the active region 215 as well as the impurity ion region 230 opposite to the device isolation layer 210.

Figure 21:
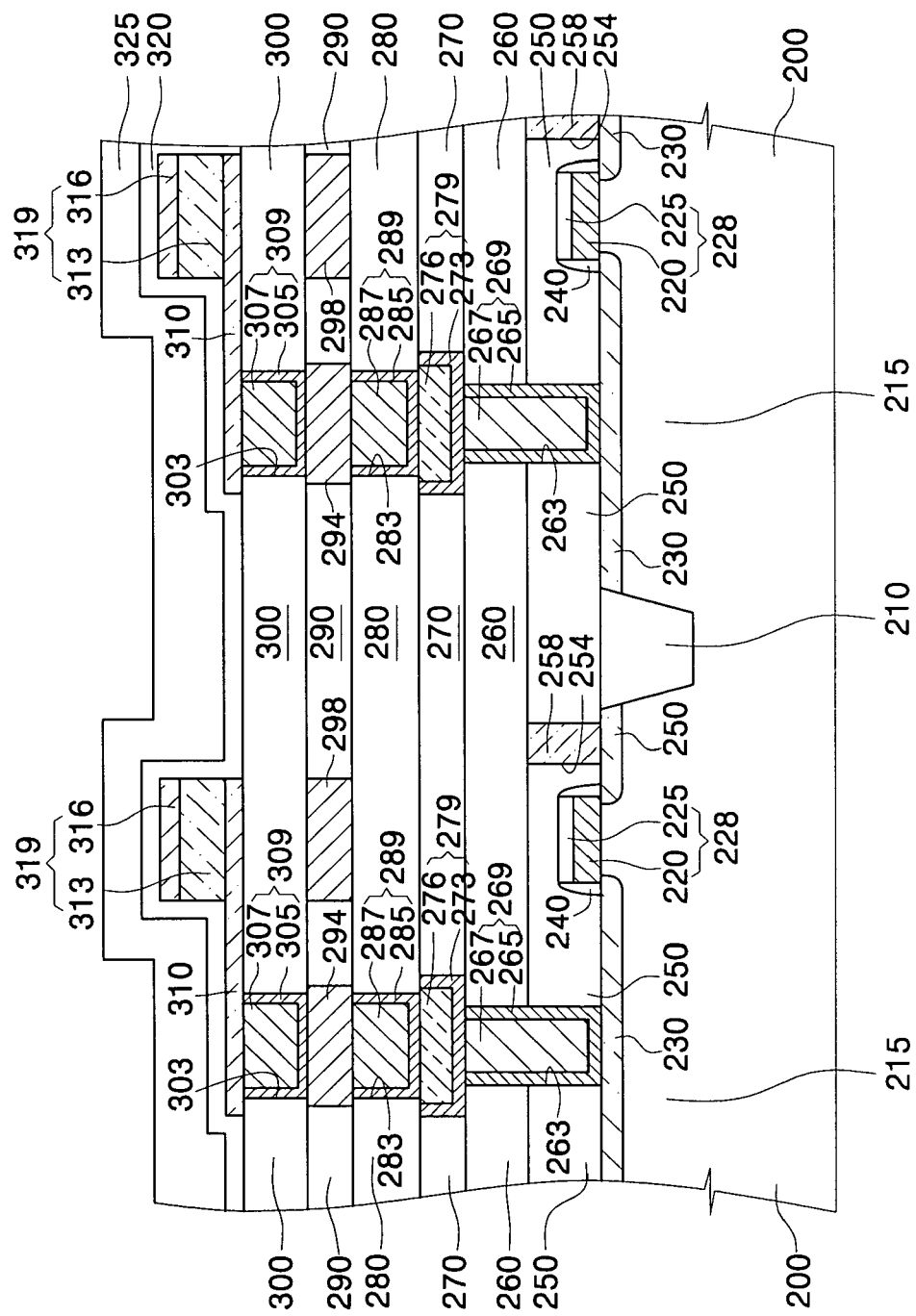
Figure 22:
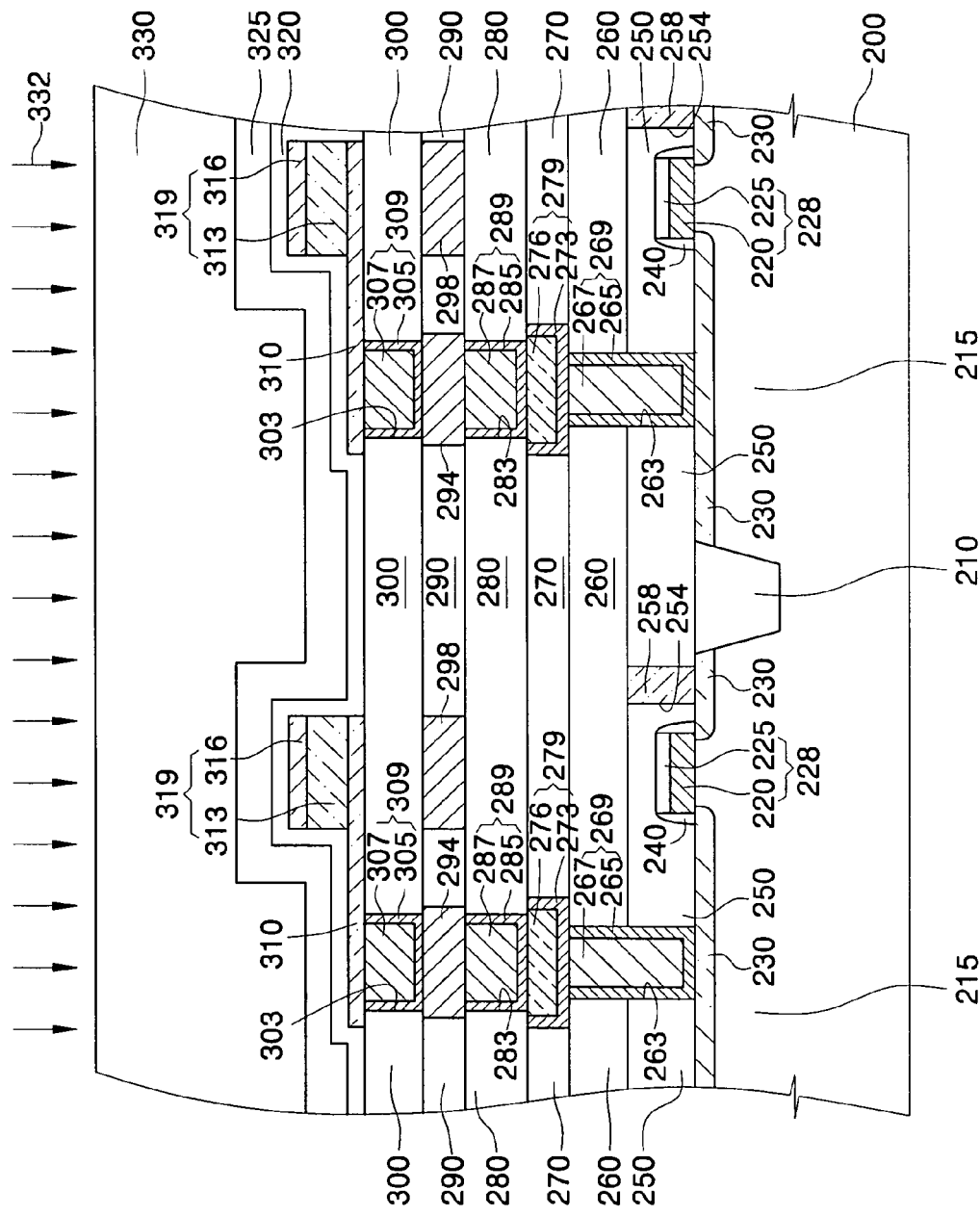

Referring to FIGS. 1, 21, and 22, a planarized capping layer 320 and a planarized protecting layer 325 are formed to sequentially cover the magnetic tunnel junction patterns 319. The planarized protecting layer 325 is formed by using an insulating layer having an etching ratio different from that of the planarized capping layer 320. The planarized capping layer 320 may be formed by using a silicon nitride ($Si_3N_4$). The planarized capping layer 320 may be formed by performing a CVD process or an ALD process. The planarized protecting layer 325 may be formed by using a silicon oxide ($SiO_2$).

A planarized insulating layer 330 is formed to cover the planarized protecting layer 325. The planarized insulating layer 330 is formed by using an insulating layer having an etching ratio different from that of the planarized protecting layer 325. The planarized insulating layer 330 may be an insulating layer having the same etching ratio as that of the planarized protecting layer 325. A first planarization process 332 is performed on the planarized insulating layer 330. The first planarization process 332 may be performed to have an etching ratio with respect to the planarized insulating layer 330 over the planarized protecting layer 325. The first planarization process 332 can be performed by using a CMP or an etching back technique.

Figure 23:
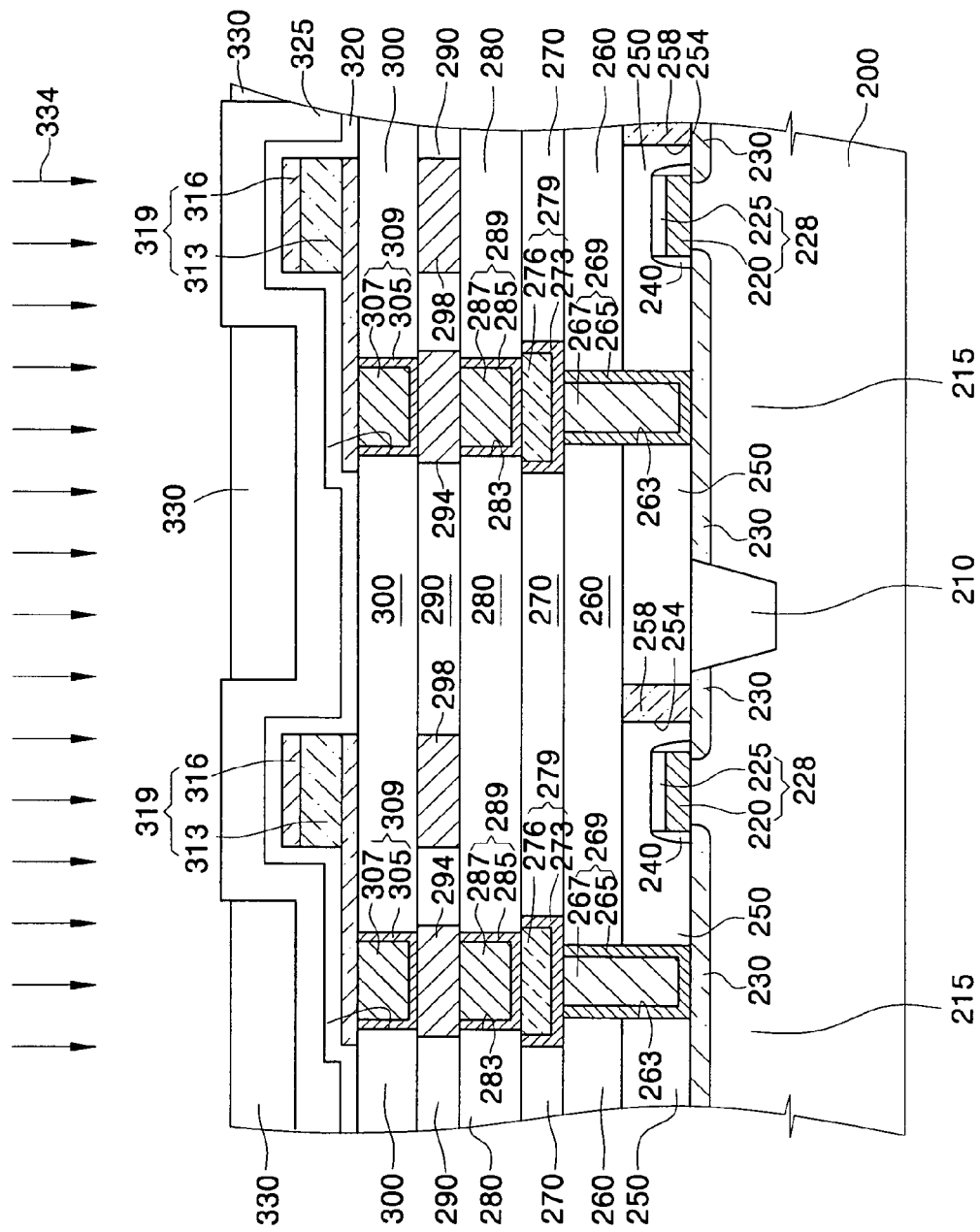
Figure 24:
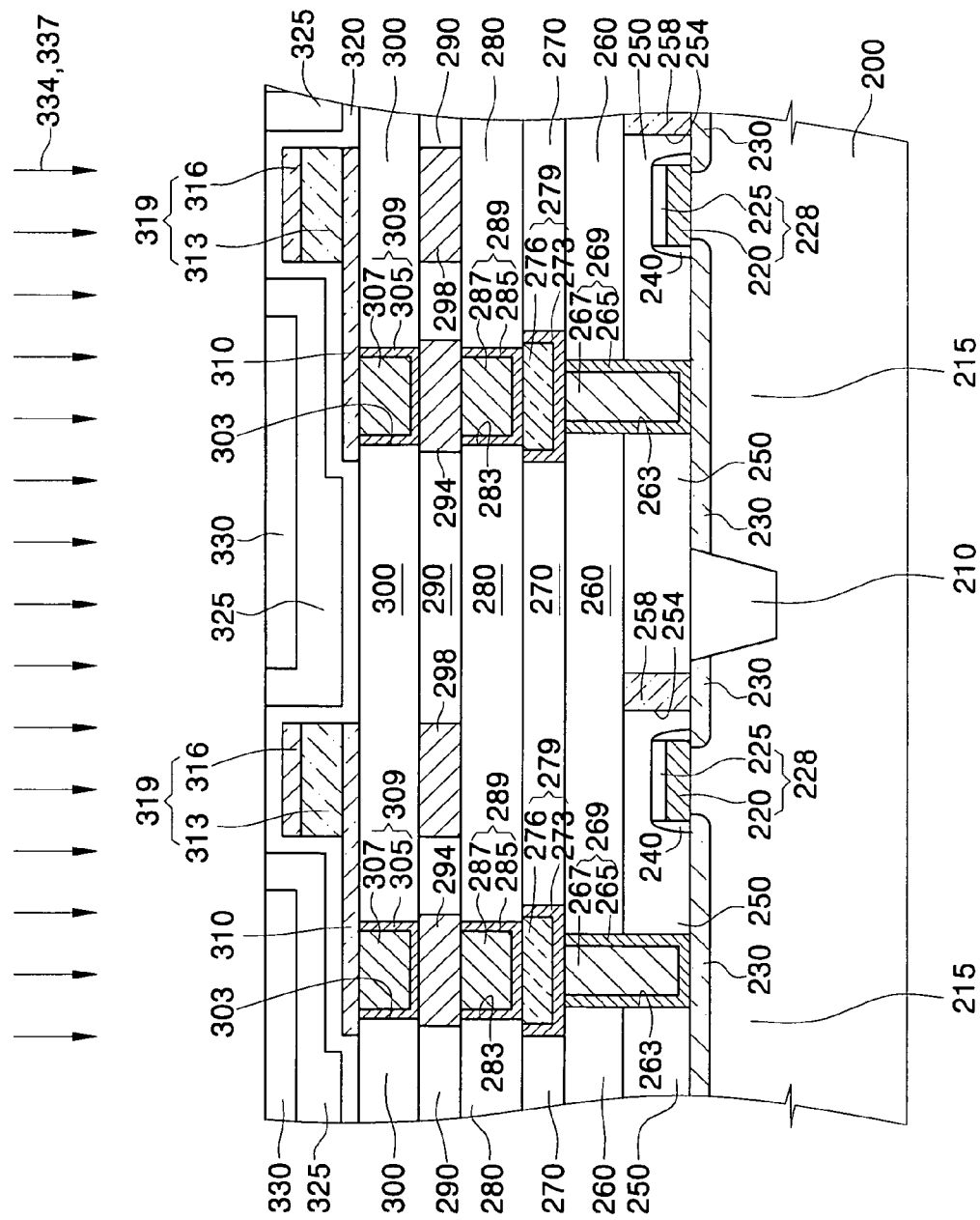
Figure 25:
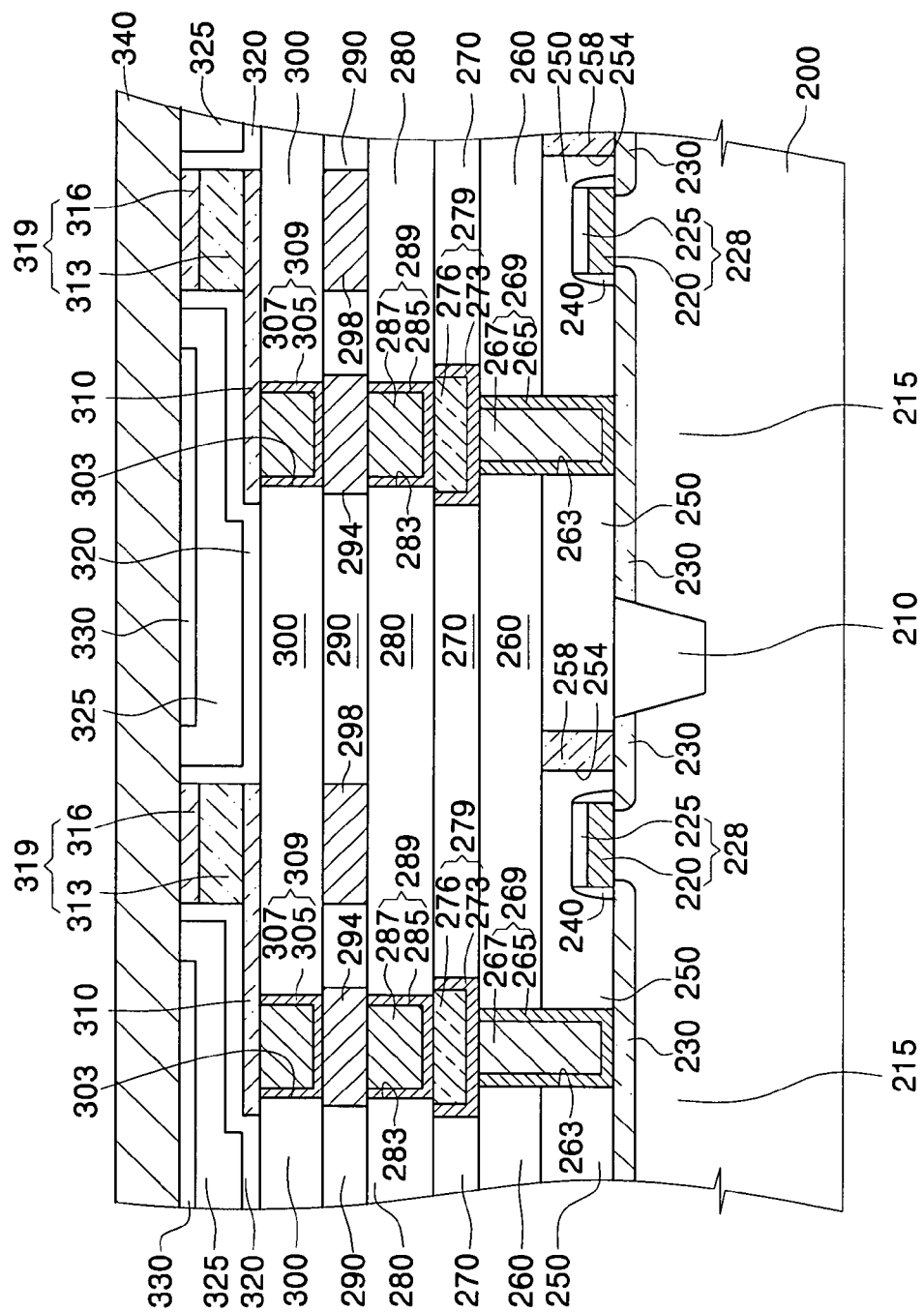
Figure 26:
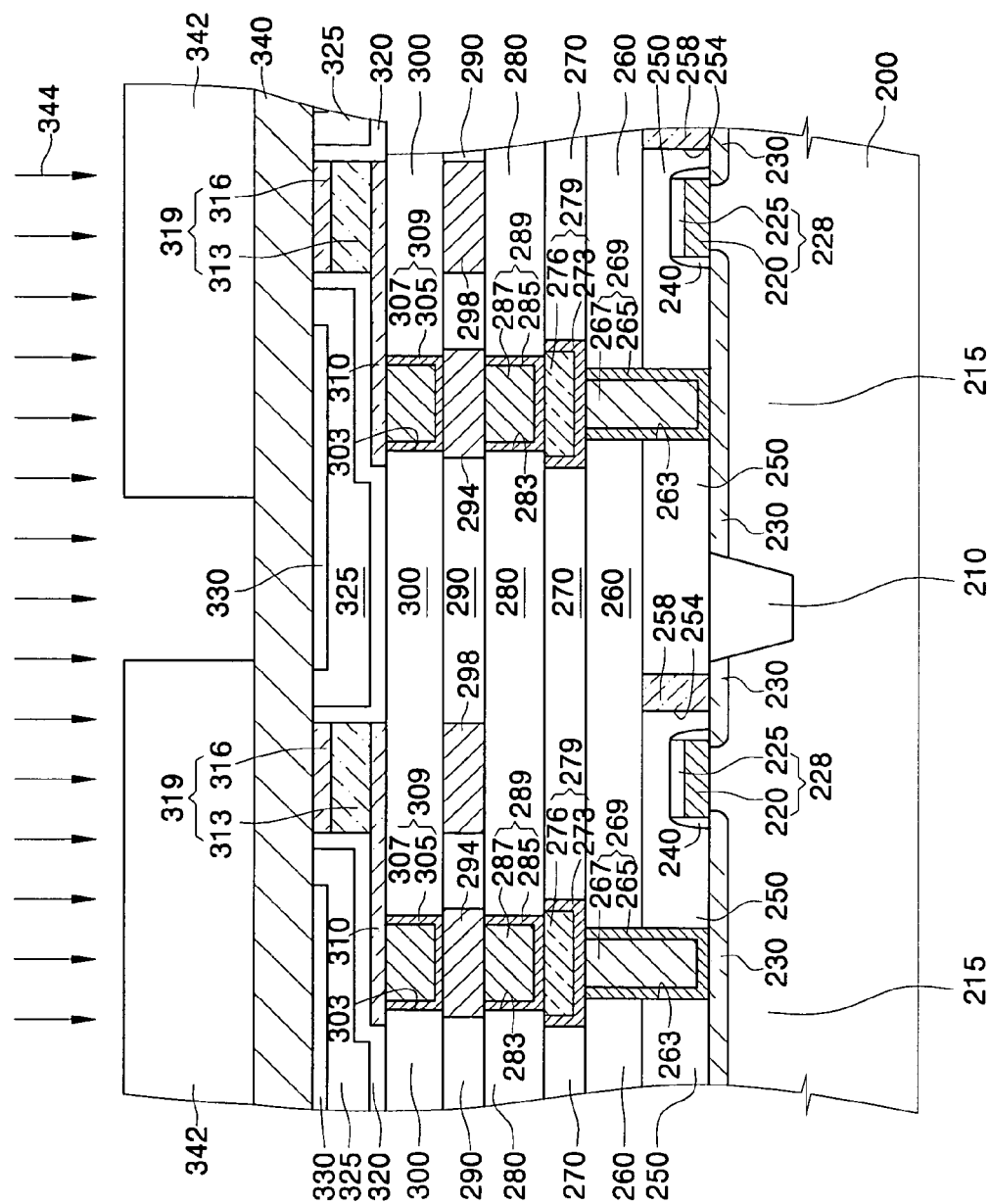
Figure 27:
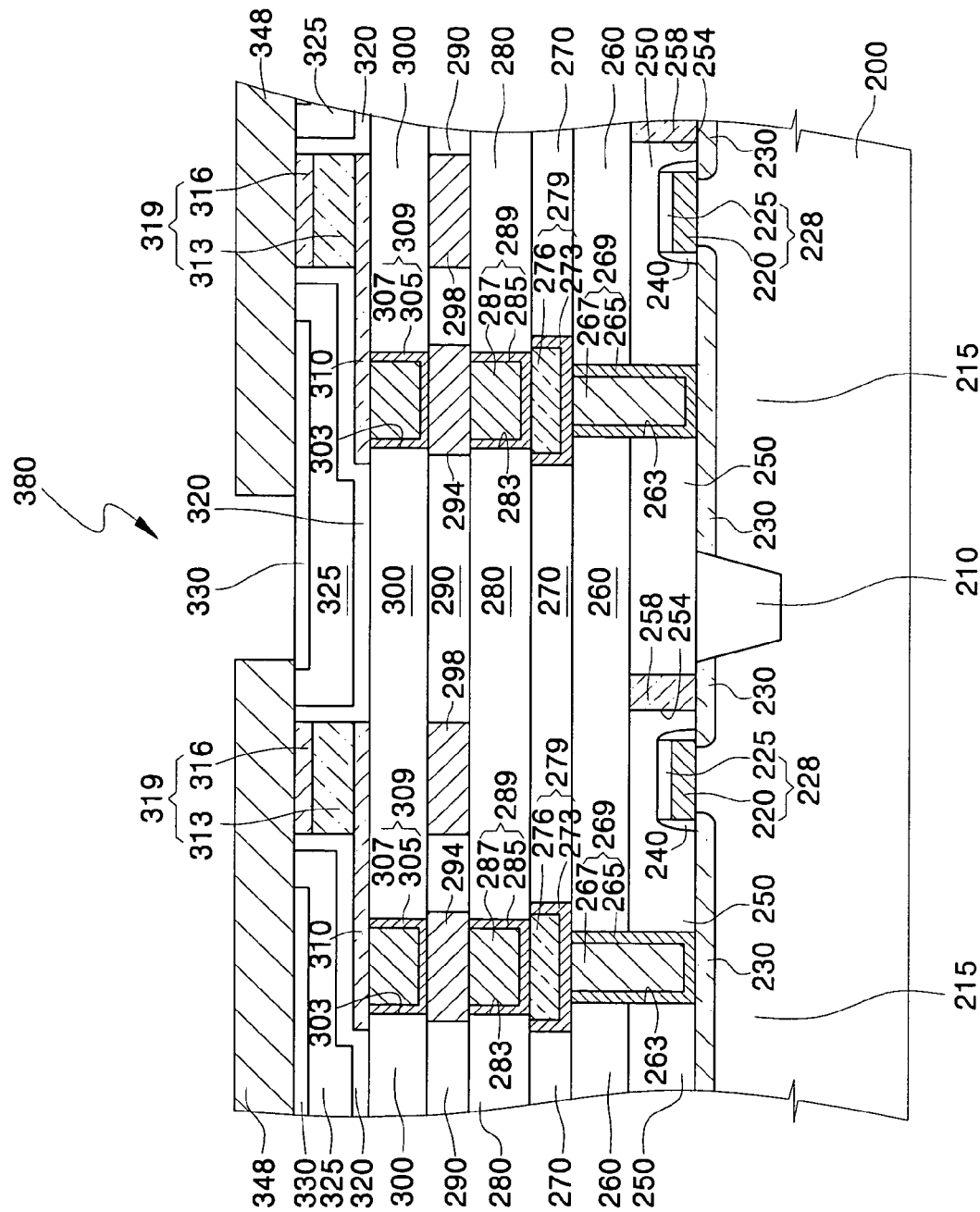

Referring to FIGS. 2, 23, and 24, the first planarization process 332 is performed on the planarized insulating layer 330, thereby exposing the planarized protecting layers 325.

Subsequently, a second planarization process 334 is performed on the planarized protecting layers 325 and the planarized insulating layer 330. The second planarization process 334 may be performed to have an etching ratio with respect to the planarized protecting layer 325 and the planarized insulating layer 330 over the planarized capping layer 320. The second planarization process 334 can be performed by using a CMP or an etching back technique.

The second planarization process 334 exposes the planarized capping layer 320 by using the planarized insulating layer 330 and the planarized protecting layers 325. A first wet etching process 336 is performed on the planarized capping layer 320 by using the planarized protecting layers 325 and the planarized insulating layer 330 as an etching mask. By the first wet etching process 336, the planarized capping layer 320 on the magnetic tunnel junction patterns 319 is removed. The first wet etching process 336 may be performed by using phosphoric acid ($H_3PO_4$).

A second wet etching process 337 is performed on the planarized insulating layer 330 and the planarized protecting layers 325 by using the planarized capping layers 320 and the magnetic tunnel junction patterns 319 as an etching mask. The second wet etching process 337 can be performed by using hydrofluoric acid (HF).

Referring to FIGS. 2, and 25 through 27, the planarized protecting layers 325 and the planarized insulating layer 330 are partially removed by the second wet etching process 337. Through the first and the second wet etching processes 336, 337, the magnetic tunnel junction patterns 319 have about the same surface level as those of the planarized capping layer 320, the planarized protecting layer 325, and the planarized insulating layer 330. An interconnection layer 340 is formed to cover the planarized capping layers 320, the planarized protecting layers 325, the planarized insulating layer 330, and the magnetic tunnel junction patterns 319. The interconnection layer 340 is formed by using a metal having a low resistance, such as, for example, aluminum (Al) except tungsten (W).

Photoresist patterns 342 are formed on the interconnection layer 340. The photoresist patterns 342 may be formed to overlap the magnetic tunnel junction patterns 319, respectively. A dry etching process 344 is performed on the interconnection layer 340 by using the photoresist pattern 342 as an etching mask. The dry etching process 344 can be performed to etch the interconnection layer 340 over the planarized capping layers 320, the planarized protecting layers 325, the planarized insulating layer 330, and the magnetic tunnel junction patterns 319. An interconnection layer pattern 348 is formed on the planarized capping layer 320, the planarized protecting layer 325, and the planarized insulating layer 330 with a positive shape. As a result, the cell of a MRAM 380 is formed, in which the magnetic tunnel junction patterns 319 and the interconnection layer pattern 348 are directly in contact with each other.

FIGS. 28 through 31 are sectional views illustrating methods of forming a semiconductor device taken along line II-II' of FIG. 2, respectively, in accordance with further embodiments of the present invention.

Like numerals refer to like elements in FIGS. 28 through 31 and FIGS. 20 through 27. A formation of component elements until exposing magnetic tunnel junction patterns 319 on a semiconductor substrate 200 uses the methods described with reference to FIGS. 20 through 24 in accordance with some embodiments of the present invention.

Figure 28:
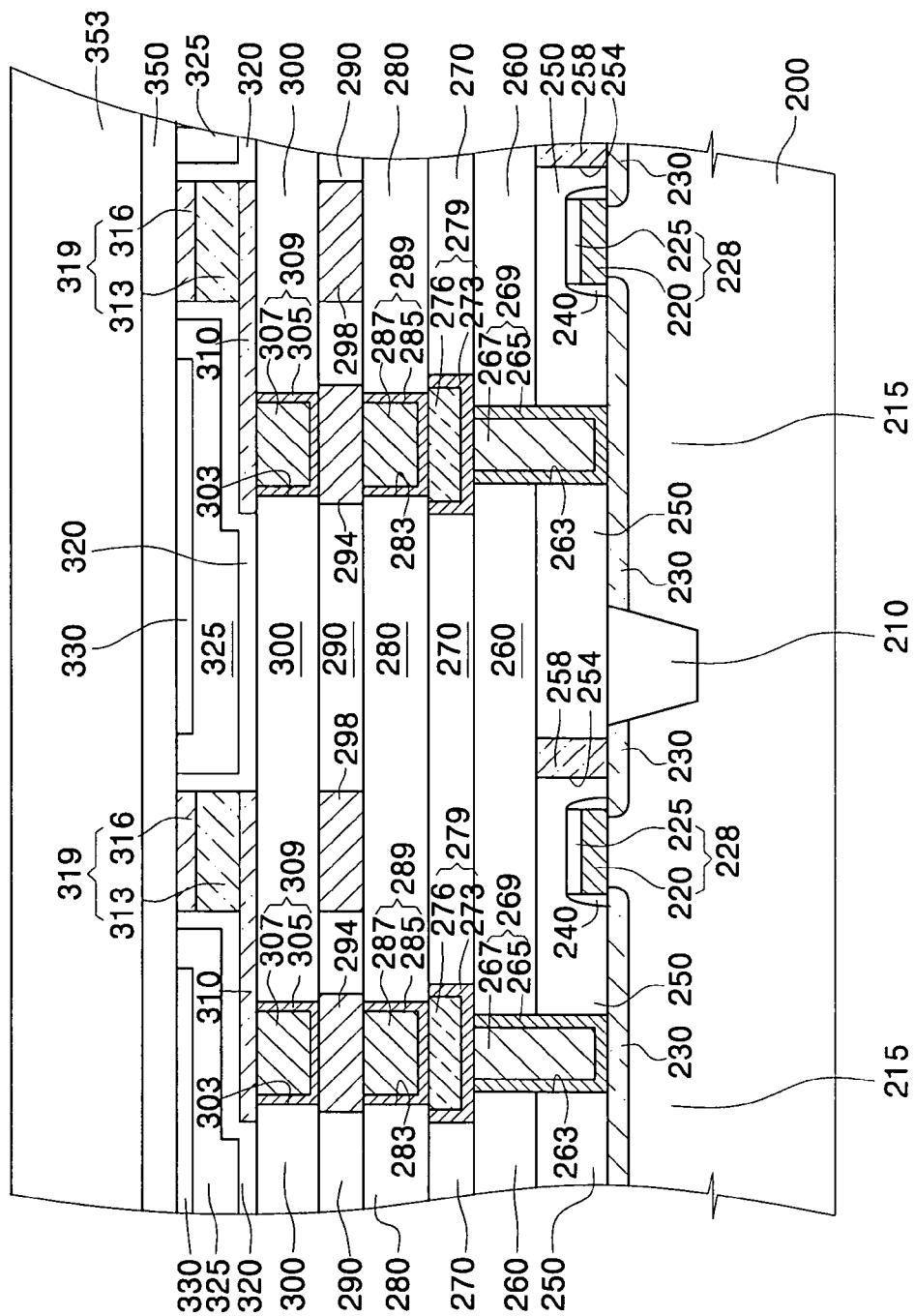
FIGS. 28 through 31 are sectional views illustrating further methods of forming a semiconductor device taken along line II-II' of FIG. 2, respectively, in accordance with some embodiments of the present invention.
Figure 29:
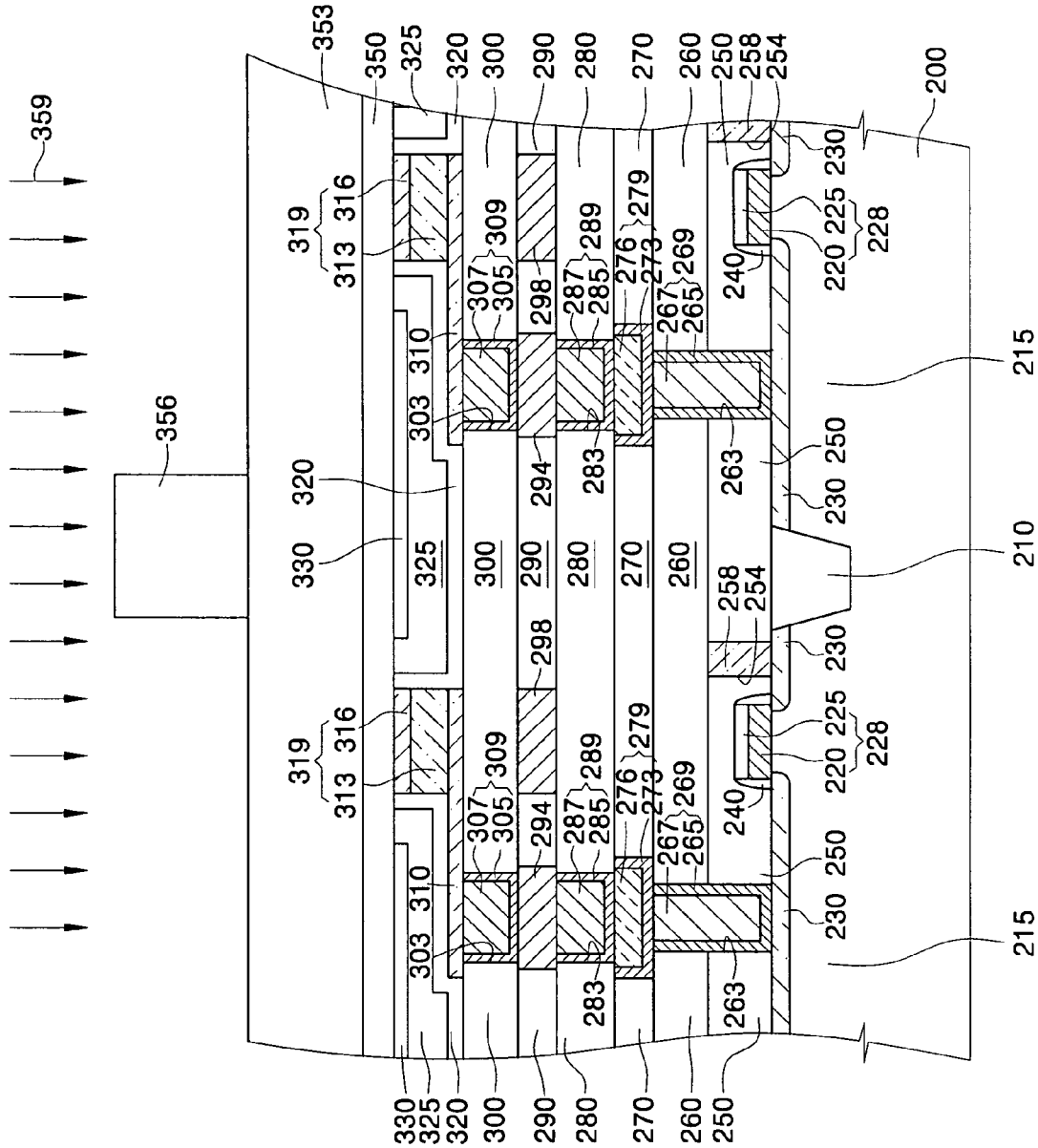

Referring to FIGS. 2, 28, and 29, the magnetic tunnel junction patterns 319 are exposed by using the planarized capping layer 320, the planarized protecting layer 325, and the planarized insulating layer 330. An etching buffer layer 350 and an etching stop layer 353 are formed to cover the magnetic tunnel junction patterns 319, the planarized capping layer 320, the planarized protecting layer 325 and the planarized insulating layer 330. The etching stop layer 353 is formed by using an insulating layer having an etching ratio different from that of the etching buffer layer 350.

A photoresist pattern 356 is formed on the etching stop layer 353 to expose the magnetic tunnel junction patterns 319. By using the photoresist pattern 356 as an etching mask, a dry etching process 359 is sequentially performed on the etching stop layer 353 and the etching buffer layer 350.

Figure 30:
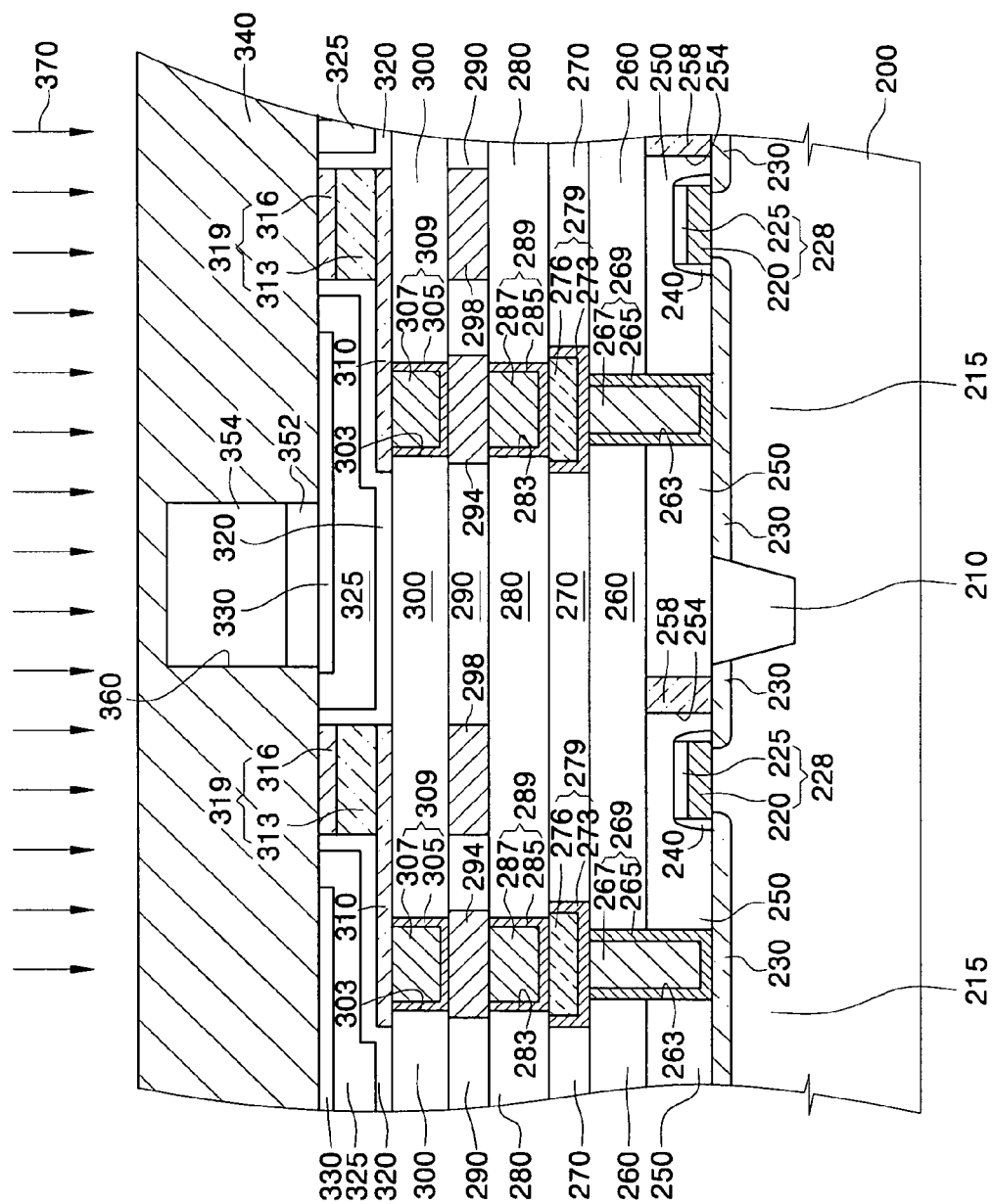
Figure 31:
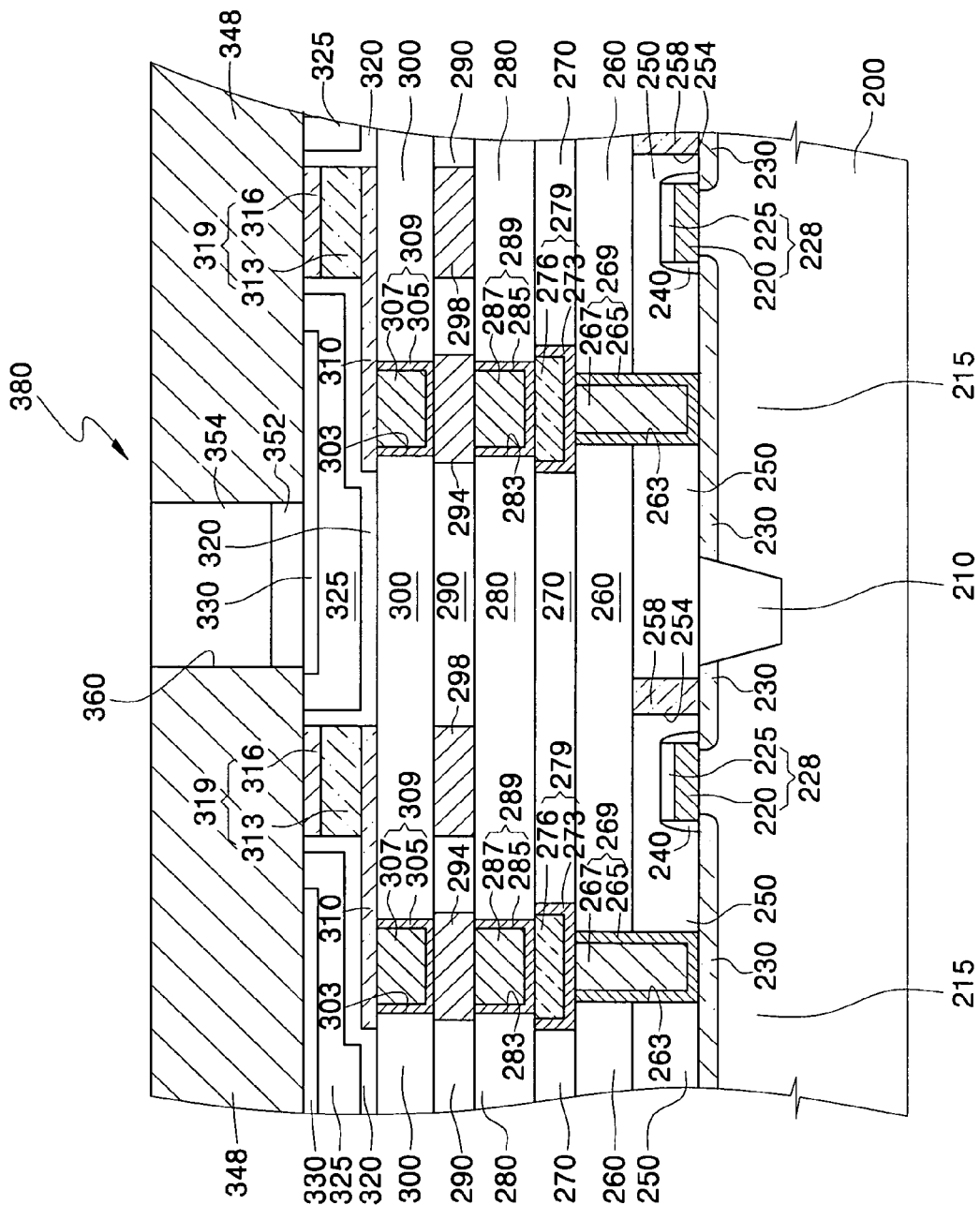

Referring to FIGS. 2, 30, and 31, the dry etching process 359 forms an etching buffer layer and etching stop layer patterns 352, 354, which are sequentially stacked. A trench 360, which has a predetermined depth, is formed in the etching buffer layer and etching stop layer patterns 352, 354. Thus, the etching buffer layer and etching stop layer patterns 352, 354 expose the magnetic tunnel junction patterns 319 through the trench 360.

An interconnection layer 340 is formed to fill the trench 360 and concurrently cover an upper surface of the etching stop layer pattern 354. The interconnection layer 340 may be formed by using a low resistance metal, such as, for example, aluminum (Al) except tungsten (W). A planarization process 370 is performed on the interconnection layer 340 to expose the etching stop layer pattern 354. By the planarization process 370, an interconnection layer pattern 348 is formed with a negative shape, while isolating the etching buffer layer and etching stop layer patterns 352, 354. The planarization process 370 can be performed by using a CMP technique. The planarization process 370 may be performed to have an etching ratio with respect to the interconnection layer 340 over the etching stop layer pattern 354. As a result, a cell of an MRAM 380 is formed in which the magnetic tunnel junction patterns 319 and the interconnection layer pattern 348 are directly in contact with each other.

FIGS. 32 through 35 are sectional views illustrating methods of forming a semiconductor device taken along line II-II' of FIG. 2, respectively, in accordance with further embodiments of the present invention.

Like numerals refer to like elements in FIGS. 32 through 35 and FIGS. 20 through 27. A formation of component elements until forming magnetic tunnel junction patterns 319 on a semiconductor substrate 200 uses the methods described with reference to FIG. 20 in accordance with some embodiments of the present invention.

Figure 32:
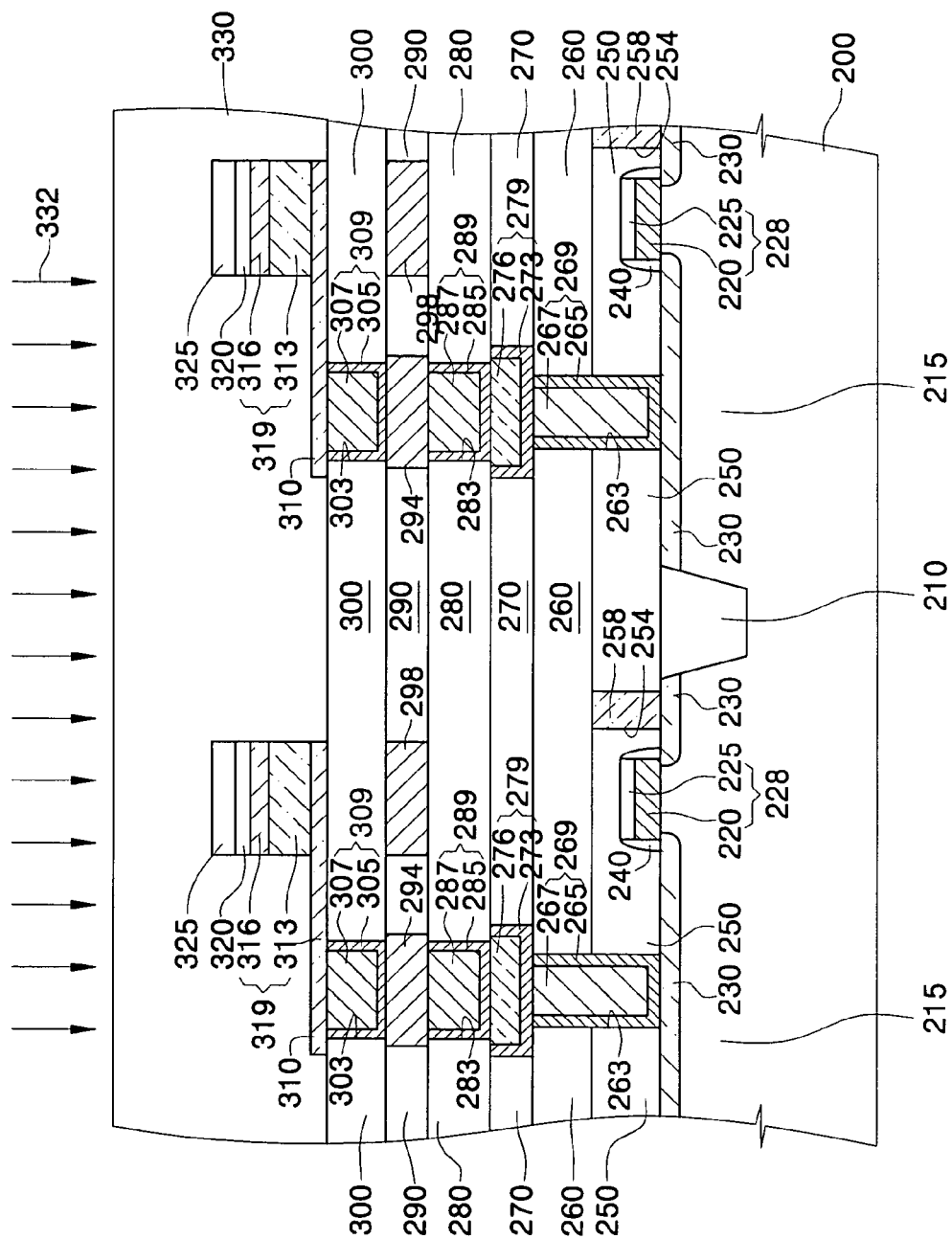
FIGS. 32 through 35 are sectional views illustrating further methods of forming a semiconductor device taken along line II-II' of FIG. 2, respectively, in accordance with some embodiments of the present invention.
Figure 33:
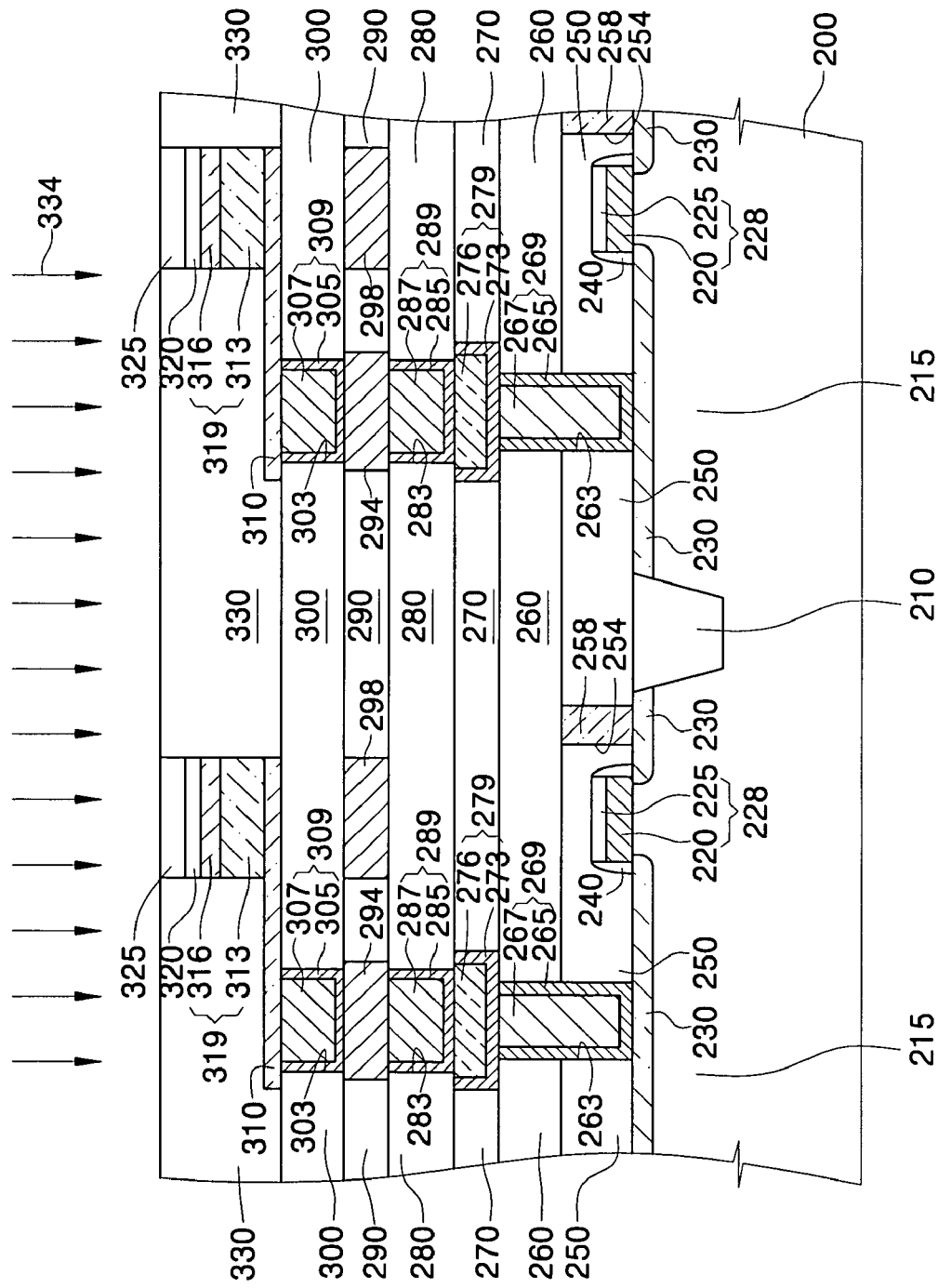

Referring to FIGS. 2, 32, and 33, a planarized capping layer 320 and a planarized protecting layer 325 are sequentially formed on each of the magnetic tunnel junction patterns 319. A planarized insulating layer 330 is formed to sufficiently cover the pad layer patterns 310 as well as the planarized protecting layers 325, the planarized capping layers 320, and the magnetic tunnel junction patterns 319. A first planarization process 332 is performed on the planarized insulating layer 330. The first planarization process 332 may be performed to have an etching ratio with respect to the planarized insulating layer 330 over the planarized protecting layer 325. The first planarization process 332 can be performed by using a CMP or an etching back technique.

The first planarization process 332 is performed to expose the planarized protecting layers 325 by using the planarized insulating layer 330. A second planarization process 334 is sequentially performed on the planarized protecting layers 325 and the planarized insulating layer 330. The second planarization process 334 may be performed to have an etching ratio with respect to the planarized protecting layers 325 and the planarized insulating layer 330 over the planarized capping layer 320. The second planarization process 334 can be performed by using a CMP or an etching back technique.

Figure 34:
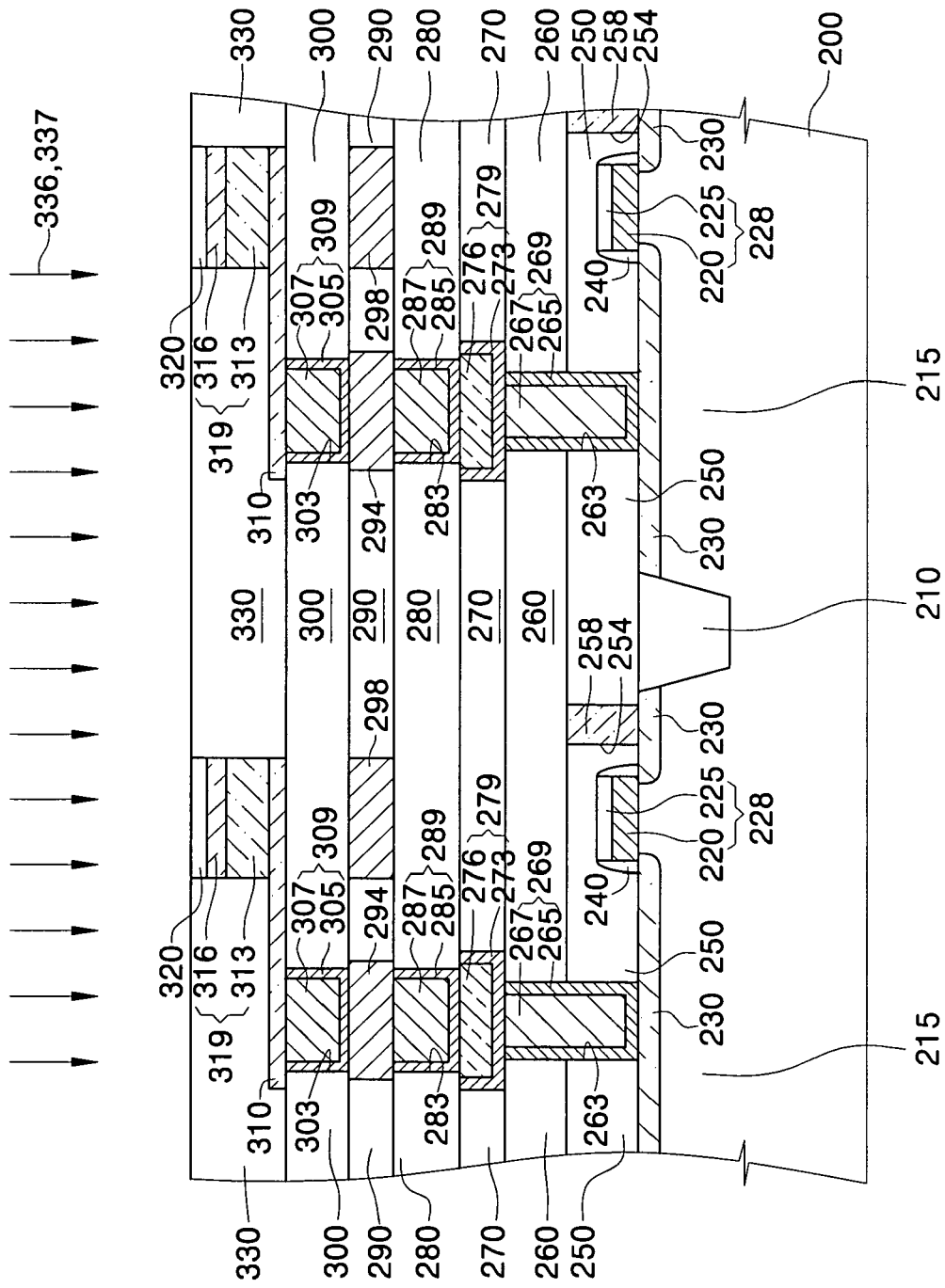
Figure 35:
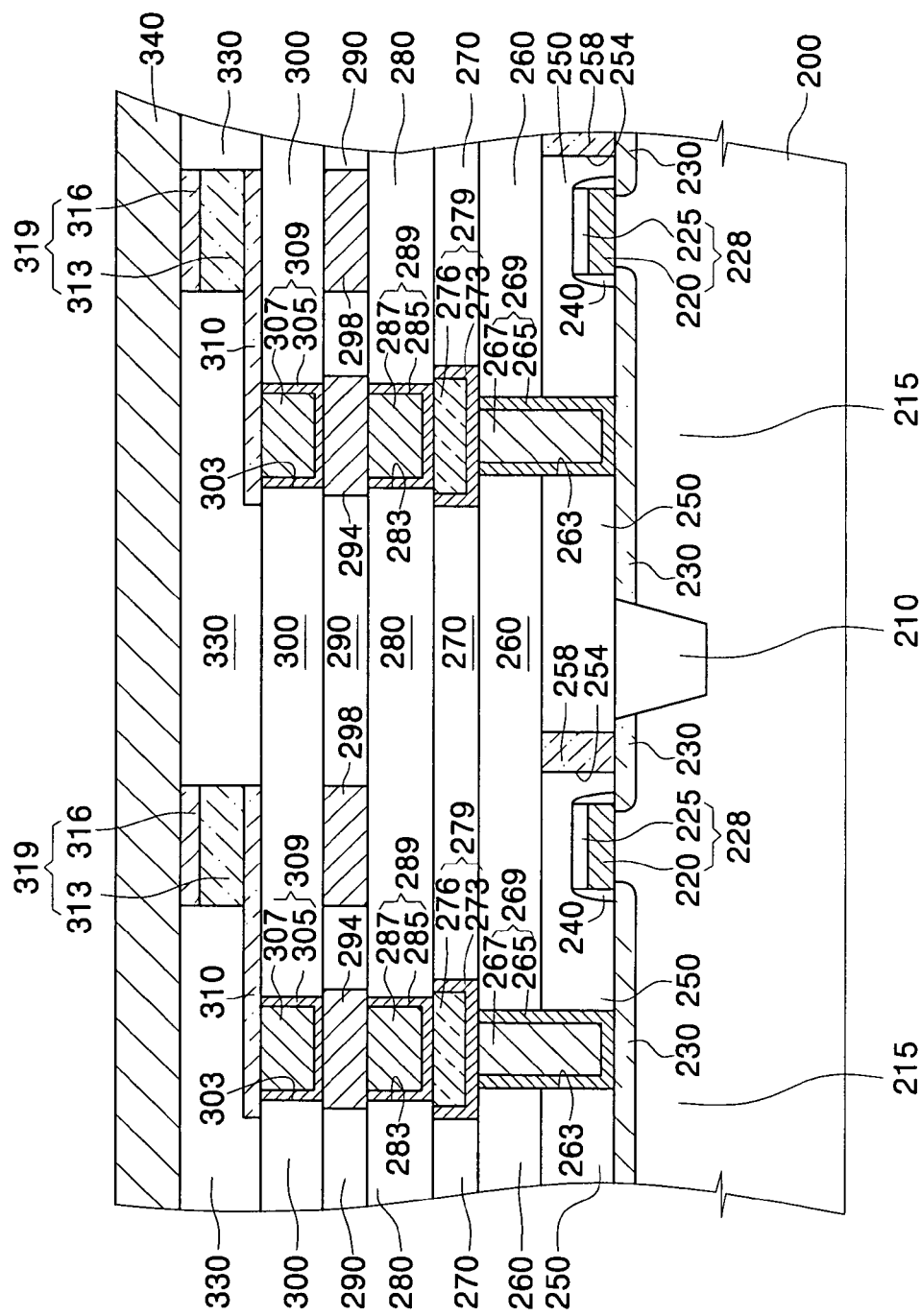

Referring to FIGS. 2, 34, and 35, the second planarization process 334 exposes the planarized capping layers 320 by using the planarized insulating layer 330. A first wet etching process 336 is performed on the planarized capping layers 320 by using the planarized insulating layer 330 as an etching mask. By the first wet etching process 336, the planarized capping layer 320 on each of the magnetic tunnel junction patterns 319 is removed. The first wet etching process 336 may be performed by using phosphoric acid ($H_3PO_4$).

A second wet etching process 337 is performed on the planarized insulating layer 330 by using the magnetic tunnel junction patterns 319 as an etching mask. The second wet etching process 337 can be performed by using hydrofluoric acid (HF). An interconnection layer 340 is formed to cover the planarized insulating layer 330 and the magnetic tunnel junction patterns 319. The interconnection layer 340 is formed by using a metal having a low resistance, such as, for example, aluminum (Al) except tungsten (W). Then, the interconnection layer pattern 348 with a positive shape, which is directly in contact with the magnetic tunnel junction patterns 319, may be formed by using methods described with reference to FIGS. 26 and 27 in accordance with some embodiments of the present invention. Further, the interconnection layer pattern 348 with a negative shape, which is directly in contact with the magnetic tunnel junction patterns 319, may be formed with reference to methods described above regarding the interconnection layer 340 described with reference to FIGS. 28 through 31.

As described above, according to some embodiments of the invention, the selected cell on the active region and the interconnection layer pattern are electrically connected to each other without the use of contact holes by disposing the planarized insulating layer under the interconnection layer pattern. As such, the invention may improve production yield of semiconductor devices from the semiconductor substrate through simplification and stability of the semiconductor fabrication process.

Various embodiments of semiconductor devices having a planarized insulating layer and methods of fabricating the same will now be described. According to some embodiments of the invention, there is provided a semiconductor device having a planarized insulating layer that includes at least one phase-change pattern disposed over a semiconductor substrate. A planarized capping layer, a planarized protecting layer, and a planarized insulating layer are sequentially stacked to surround the phase-change pattern. An interconnection layer pattern is disposed on the planarized capping layer, the planarized protecting layer, and the planarized insulating layer. The interconnection layer pattern is in contact with the phase-change pattern.

According to some embodiments of the invention, there is provided a semiconductor device having a planarized insulating layer that includes at least one phase-change pattern disposed over a semiconductor substrate. A planarized insulating layer is disposed so as to surround the phase-change pattern. An interconnection layer pattern is disposed on the planarized insulating layer, and is in contact with the phase-change pattern.

According to some embodiments of the invention, there is provided a semiconductor device having a planarized insulating layer that includes at least one magnetic tunnel junction pattern disposed over a semiconductor substrate. A planarized capping layer, a planarized protecting layer, and a planarized insulating layer are sequentially stacked to surround the magnetic tunnel junction pattern. An interconnection layer pattern is disposed on the planarized capping layer, the planarized protecting layer, and the planarized insulating layer. The interconnection layer pattern is in contact with the magnetic tunnel junction pattern.

According to some embodiments of the invention, there is provided a semiconductor device having a planarized insulating layer that includes at least one magnetic tunnel junction pattern disposed over a semiconductor substrate. A planarized insulating layer is disposed so as to surround the magnetic tunnel junction pattern. An interconnection layer pattern is disposed on the planarized insulating layer and is in contact with the magnetic tunnel junction pattern.

According to some embodiments of the invention, there is provided a method of forming a semiconductor device having a planarized insulating layer that includes forming at least one phase-change pattern over a semiconductor substrate. A planarized capping layer, a planarized protecting layer, and a planarized insulating layer are sequentially formed to cover the phase-change pattern. The phase-change pattern is exposed by using the planarized insulating layer, the planarized protecting layer, and the planarized capping layer. An interconnection layer pattern is formed on the planarized insulating layer, the planarized protecting layer, and the planarized capping layer, to be in contact with the phase-change pattern.

According to some embodiments of the invention, there is provided a method of forming a semiconductor device having a planarized insulating layer that includes forming at least one phase-change pattern disposed over a semiconductor substrate. A planarized capping layer and a planarized protecting layer are sequentially formed on the phase-change pattern. A planarized insulating layer is formed to cover the planarized protecting layer, the planarized capping layer, and the phase-change pattern. The phase-change pattern is exposed by using the planarized insulating layer. An interconnection layer pattern is formed on the planarized insulating layer so as to be in contact with the phase-change pattern.

According to some embodiments of the invention, there is provided a method of forming a semiconductor device having a planarized insulating layer that includes forming at least one magnetic tunnel junction pattern over a semiconductor substrate. A planarized capping layer, a planarized protecting layer, and a planarized insulating layer are sequentially formed to cover the magnetic tunnel junction pattern. The magnetic tunnel junction pattern is exposed by using the planarized insulating layer, the planarized protecting layer, and the planarized capping layer. An interconnection layer pattern is formed on the planarized insulating layer, the planarized protecting layer, and the planarized capping layer, so as to be in contact with the magnetic tunnel junction pattern.

According to further embodiments of the invention, there is provided a method of forming a semiconductor device having a planarized insulating layer that includes forming at least one magnetic tunnel junction pattern over a semiconductor substrate. A planarized capping layer and a planarized protecting layer are sequentially formed on the magnetic tunnel junction pattern. A planarized insulating layer is formed to cover the planarized protecting layer, the planarized capping layer, and the magnetic tunnel junction pattern. The magnetic tunnel junction pattern is exposed by using the planarized insulating layer. An interconnection layer pattern is formed on the planarized insulating layer so as to be in contact with the magnetic tunnel junction pattern.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A method of fabricating a semiconductor device, comprising:
    forming at least one phase-change pattern on a semiconductor substrate;
    sequentially forming a planarized capping layer, a planarized protecting layer, and a planarized insulating layer to cover the at least one phase-change pattern;
    removing the planarized insulating layer, the planarized protecting layer, and the planarized capping layer to expose an entire top surface of the at least one phase-change pattern and surround sidewalls of the at least one phase-change pattern; and
    forming an interconnection layer pattern traversing removed surfaces of the planarized insulating layer, the planarized protecting layer, and the planarized capping layer so as to be in direct contact with the at least one phase-change pattern;
    wherein the removed surfaces are the same level as the entire top surface.

2. The method according to claim 1, wherein forming the interconnection layer pattern comprises:
    forming an interconnection layer on the planarized capping layer, the planarized protecting layer, the planarized insulating layer, and the exposed at least one phase-change pattern;
    forming a photoresist pattern on the interconnection layer; and
    performing a dry etching process on the interconnection layer by using the photoresist pattern as an etching mask.

3. The method according to claim 1, wherein forming the interconnection layer pattern comprises:
    forming an etching buffer layer and an etching stop layer sequentially on the planarized capping layer, the planarized protecting layer, the planarized insulating layer, and the exposed at least one phase-change pattern; and
    forming a photoresist pattern on the etching stop layer.

4. The method according to claim 3, further comprising:
    performing a dry etching process on the etching stop layer and the etching buffer layer by using the photoresist pattern as an etching mask, thereby forming an etching stop layer pattern and an etching buffer layer pattern;
    forming an interconnection layer covering the etching stop layer pattern and the etching buffer layer pattern; and
    performing a planarization process on the interconnection layer, thereby exposing the etching stop layer pattern.

5. The method according to claim 1, wherein exposing the entire top surface of the at least one phase-change pattern comprises:
    performing a first planarization process on the planarized insulating layer, thereby exposing the planarized protecting layer; and
    performing a second planarization process on the planarized insulating layer and the planarized protecting layer, thereby exposing the planarized capping layer.

6. The method according to claim 5, wherein the second planarization process is performed so as to have an etching ratio with respect to the planarized insulating layer and the planarized protecting layer over the planarized capping layer.

7. The method according to claim 5, wherein the first planarization process is performed so as to have an etching ratio with respect to the planarized insulating layer over the planarized protecting layer.

8. The method according to claim 5, further comprising:
    performing a first wet etching process on the planarized capping layer, by using the planarized insulating layer and the planarized protecting layer as an etching mask; and
    performing a second wet etching process on the planarized insulating layer and the planarized protecting layer by using the planarized capping layer and the at least one phase-change pattern as an etching mask.

9. The method according to claim 1, wherein the planarized insulating layer is formed using an insulating layer having an etching ratio different from that of the planarized protecting layer.

10. The method according to claim 1, wherein the planarized insulating layer is formed by using an insulating layer having a same etching ratio as that of the planarized protecting layer.

11. The method according to claim 1, wherein the planarized protecting layer is formed by using an insulating layer having an etching ratio different from that of the planarized capping layer.

12. The method according to claim 1, wherein forming the at least one phase-change pattern comprises:
    forming a phase-change layer pattern; and
    forming a phase-change layer node pattern on the phase-change layer pattern.

13. The method according to claim 1, wherein the semiconductor device is formed in a PRAM.

14. A method of fabricating a semiconductor device comprising:
    forming at least one phase-change pattern on a semiconductor substrate;
    sequentially forming a planarized capping layer and a planarized protecting layer on a top surface of the at least one phase-change pattern;
    forming a planarized insulating layer to cover the planarized protecting layer, the planarized capping layer, and the at least one phase-change pattern;
    removing the planarized insulating layer, the planarized protecting layer, and the planarized capping layer to expose an entire top surface of the at least one phase-change pattern, the planarized insulating layer surrounding sidewalls of the at least one phase-change pattern; and
    forming an interconnection layer pattern traversing a removed surface of the planarized insulating layer so as to be in direct contact with the entire top surface of the at least one phase-change pattern;
    wherein the removed surface is the same level as the entire top surface.

15. The method according to claim 14, wherein forming the interconnection layer pattern comprises:
    forming an interconnection layer on the planarized insulating layer and the exposed at least one phase-change pattern;
    forming a photoresist pattern on the interconnection layer; and
    performing a dry etching process on the interconnection layer by using the photoresist pattern as an etching mask.

16. The method according to claim 14, wherein forming the interconnection layer pattern comprises:
    sequentially forming an etching buffer layer and an etching stop layer on the planarized insulating layer and the exposed at least one phase-change pattern; and
    forming a photoresist pattern on the etching stop layer.

17. The method according to claim 16, further comprising:

performing a dry etching process on the etching stop layer and the etching buffer layer by using the photoresist pattern as an etching mask, thereby forming an etching stop layer pattern and an etching buffer layer pattern;

forming an interconnection layer covering the etching stop layer pattern and the etching buffer layer pattern; and performing a planarization process on the interconnection layer, thereby exposing the etching stop layer pattern.

18. The method according to claim 14, wherein exposing the entire top surface of the at least one phase-change pattern comprises:

performing a first planarization process on the planarized insulating layer, thereby exposing the planarized protecting layer; and performing a second planarization process on the planarized insulating layer and the planarized protecting layer, thereby exposing the planarized capping layer.

19. The method according to claim 18, wherein the second planarization process is performed to have an etching ratio with respect to the planarized insulating layer and the planarized protecting layer over the planarized capping layer.

20. The method according to claim 18, wherein the first planarization process is performed to have an etching ratio with respect to the planarized insulating layer over the planarized protecting layer.

21. The method according to claim 18, further comprising:

performing a first wet etching process on the planarized capping layer by using the planarized insulating layer as an etching mask; and performing a second wet etching process on the planarized insulating layer by using the at least one phase-change pattern as an etching mask.

22. The method according to claim 14, wherein forming the at least one phase-change pattern comprises:

forming a phase-change layer pattern; and forming a phase-change layer node pattern on the phase-change layer pattern.

23. The method according to claim 14, wherein the semiconductor device is formed in a PRAM.

* * * * *